United States Patent
Horimai

(10) Patent No.: US 7,002,891 B2
(45) Date of Patent: Feb. 21, 2006

(54) APPARATUS AND METHOD FOR RECORDING AND REPRODUCING INFORMATION TO AND FROM AN OPTICAL STORAGE MEDIUM

(75) Inventor: Hideyoshi Horimai, Tokyo (JP)

(73) Assignee: Optware Corporation, Tokyo (JP)

( * ) Notice: Subject to any disclaimer, the term of this patent is extended or adjusted under 35 U.S.C. 154(b) by 437 days.

(21) Appl. No.: 10/343,957

(22) PCT Filed: Jun. 28, 2001

(86) PCT No.: PCT/JP01/05590

§ 371 (c)(1),
(2), (4) Date: Feb. 5, 2003

(87) PCT Pub. No.: WO02/15176

PCT Pub. Date: Feb. 21, 2002

(65) Prior Publication Data

US 2004/0042374 A1    Mar. 4, 2004

(30) Foreign Application Priority Data

Aug. 7, 2000  (JP)  ............................. 2000-238326
Oct. 12, 2000 (JP)  ............................. 2000-311467

(51) Int. Cl.
*G11B 7/0065* (2006.01)
(52) U.S. Cl. ................... 369/103; 369/110.02
(58) Field of Classification Search ................ 369/103, 369/112.1, 112.16, 112.17, 110
See application file for complete search history.

(56) References Cited

U.S. PATENT DOCUMENTS

| 5,917,798 A * | 6/1999 | Horimai et al. ............. 369/103 |
| 6,366,368 B1 * | 4/2002 | Horimai ....................... 359/9 |
| 6,452,890 B1 * | 9/2002 | Kawano et al. ........ 369/110.01 |
| 2004/0100892 A1 * | 5/2004 | Horimai ..................... 369/103 |

FOREIGN PATENT DOCUMENTS

WO    WO99/44195    2/1999

* cited by examiner

*Primary Examiner*—Brian E. Miller
*Assistant Examiner*—Michael V. Battaglia
(74) *Attorney, Agent, or Firm*—Cowan Liebowitz & Latman, P.C.; Mark Montague

(57) ABSTRACT

Holographic recording and reproducing using a compact configuration provides no reduction in the recording/reproducing capability. Information light and recording-specific reference light having a spatially modulated phase are generated and projected onto an optical recording medium coaxially that converge on a reflecting surface of a recording medium. P-polarized recording-specific reference light and S-polarized information light are each optically rotated by a two-way split optical rotation plate in directions different between respective half areas of the cross section of the beam thereof. An interference paffern resulting from interference between information light yet to impinge on the reflecting surface and recording-specific reference light reflected by the reflecting surface and an interference pattern resulting from interference between recording-specific reference light yet to impinge on the reflecting surface and information light reflected by the reflecting surface are recorded in the information recording layer.

24 Claims, 9 Drawing Sheets

APPARATUS AND METHOD FOR RECORDING AND REPRODUCING INFORMATION TO AND FROM AN OPTICAL STORAGE MEDIUM

This application is a 371 of PCT/JP01/05590 Jun. 28, 2001.

TECHNICAL FIELD

The present invention relates to an optical information recording apparatus and method for recording information on an optical information recording medium through the use of holography, an optical information reproducing apparatus and method for reproducing information from an optical information recording medium through the use of holography, and an optical information recording/reproducing apparatus and method for recording information on an optical information recording medium and reproducing the information from the optical information recording medium through the use of holography.

BACKGROUND ART

In general, holographic recording for recording information in a recording medium through the use of holography is performed by superimposing light that carries image information on reference light within the recording medium and by writing a resultingly generated interference pattern into the recording medium. For reproducing the information recorded, the recording medium is irradiated with reference light such that the image information is reproduced through diffraction derived from the interference pattern.

In recent years, volume holography, or digital volume holography in particular, has been developed and is attracting attention in practical fields for ultra-high density optical recording. Volume holography is a method for writing a three-dimensional interference pattern by making positive use of a recording medium in a direction of its thickness as well, and is characterized in that it is possible to enhance the diffraction efficiency by increasing the thickness of the medium, and a greater recording capacity can be achieved by employing multiplex recording. Digital volume holography is a computer-oriented holographic recording method which uses the same recording medium and recording method as with the volume holography, whereas the image information to be recorded is limited to binary digital patterns. In the digital volume holography, analog image information such as a picture is once digitized and developed into two-dimensional digital pattern information, and then it is recorded as image information. For reproduction, this digital pattern information is read and decoded to restore the original image information for display. Consequently, even if the signal-to-noise ratio (hereinafter referred to as SN ratio) during reproduction is somewhat poor, it is possible reproduce the original information with extremely high fidelity by performing differential detection and/or error correction on the binary data encoded.

Conventional optical information recording/reproducing methods that use holography have had a problem that the reproduced information deteriorates in SN ratio if reproduction-specific reference light is also incident on a photodetector for detecting reproduction light. For that reason, in the conventional optical information recording/reproducing methods, information light and recording-specific reference light are often allowed to be incident on the recording medium with a predetermined angle therebetween at the time of recording, so that reproduction light and reproduction-specific reference light can be spatially separated from each other at the time of reproduction. Consequently, the reproduction light, which occurs at the time of reproduction, travels at a predetermined angle with respect to the reproduction-specific reference light. This allows the reproduction light and the reproduction-specific reference light to be spatially separated from each other.

Nevertheless, when the information light and the recording-specific reference light are allowed to be incident on the recording medium with a predetermined angle therebetween at the time of recording so as to spatially separate the reproduction light and the reproduction-specific reference light from each other at the time of reproduction as described above, there arises a problem that the optical system for recording and reproduction becomes greater in size.

Published Unexamined Japanese Patent Application (KOKAI) Heisei 10-124872 discloses a technique of recording an interference pattern obtained between information light and reference light in an information recording layer in which information is recorded through the use of holography, by irradiating the information recording layer with the information light and the reference light on the same side thereof such that they converge at different positions in the direction of thickness of the information recording layer.

This technique, however, has a problem that a special optical system is required for allowing the information light and the reference light to converge at different positions.

Published Unexamined Japanese Patent Application (KOKAI) Heisei 10-124872 mentioned above also discloses a technique in which a part of the cross section of the beam to be projected onto the recording medium is spatially modulated to form information light while reference light is formed of the other part of the cross section of the beam, and an interference pattern obtained therebetween is recorded in the information recording layer. In this technique, a recording medium is used which has a reflecting surface on a side of the information recording layer opposite to the side to be irradiated with the information light and the reference light, so that an interference pattern obtained between the information light yet to impinge on the reflecting surface and the reference light reflected by the reflecting surface and an interference pattern obtained between the reference light yet to impinge on the reflecting surface and the information light reflected by the reflecting surface are recorded in the information recording layer.

This technique, however, has a problem that the amount of information recordable is reduced because information can be carried by only a part of the cross section of the beam projected onto the recording medium.

DISCLOSURE OF THE INVENTION

It is an object of the invention to provide an optical information recording apparatus and method, an optical information reproducing apparatus and method, and an optical information recording/reproducing apparatus and method for recording or reproducing information through the use of holography, which allow a small configuration of the optical system for recording or reproduction without causing a reduction in the amount of information.

An optical information recording apparatus of the invention is an apparatus for recording information in an optical information recording medium having an information recording layer in which information is recorded through the use of holography and one side of which is irradiated with light for recording or reproducing information, and a reflecting surface disposed on the other side of the information recording layer, the apparatus comprising:

information light generation means for generating information light that carries information;

recording-specific reference light generation means for generating recording-specific reference light; and a recording optical system for irradiating the information recording layer with the information light generated by the information light generation means and the recording-specific reference light generated by the recording-specific reference light generation means such that the information is recorded in the information recording layer in the form of an interference pattern resulting from interference between the information light and the recording-specific reference light, wherein the recording optical system projects the information light and the recording-specific reference light coaxially onto the one side of the information recording layer such that they converge on the reflecting surface, and the recording optical system causes each of the information light and the recording-specific reference light to have directions of polarization that are different between respective half areas of a cross section of a beam thereof such that the direction of polarization of the information light yet to impinge on the reflecting surface coincides with that of the recording-specific reference light reflected by the reflecting surface, and the direction of polarization of the recording-specific reference light yet to impinge on the reflecting surface coincides with that of the information light reflected by the reflecting surface.

An optical information recording method is a method for recording information in an optical information recording medium having an information recording layer in which information is recorded through the use of holography and one side of which is irradiated with light for recording or reproducing information, and a reflecting surface disposed on the other side of the information recording layer, the method comprising:

the step of generating information light that carries information;

the step of generating recording-specific reference light; and the recording step in which the information recording layer is irradiated with the information light and the recording-specific reference light such that the information is recorded in the information recording layer in the form of an interference pattern resulting from interference between the information light and the recording-specific reference light, wherein in the recording step, the information light and the recording-specific reference light are projected coaxially onto the one side of the information recording layer such that they converge on the reflecting surface, and in the recording step, each of the information light and the recording-specific reference light is made to have directions of polarization that are different between respective half areas of a cross section of a beam thereof such that the direction of polarization of the information light yet to impinge on the reflecting surface coincides with that of the recording-specific reference light reflected by the reflecting surface, and the direction of polarization of the recording-specific reference light yet to impinge on the reflecting surface coincides with that of the information light reflected by the reflecting surface.

According to the optical information recording apparatus or the optical information recording method of the invention, the information light and the recording-specific reference light are projected coaxially onto the one side of the information recording layer such that they converge on the reflecting surface. In the optical information recording layer, the direction of polarization of the information light yet to impinge on the reflecting surface coincides with that of the recording-specific reference light reflected by the reflecting surface, so that an interference pattern resulting from interference therebetween is recorded. On the other hand, the direction of polarization of the recording-specific reference light yet to impinge on the reflecting surface coincides with that of the information light reflected by the reflecting surface, so that an interference pattern resulting from interference therebetween is recorded.

In the optical information recording apparatus of the invention, the recording optical system may have optical rotation means for optically rotating light passing therethrough in directions different between the respective areas, and may optically rotate, with the optical rotation means, each of the recording-specific reference light having a predetermined first direction of polarization and the information light having a second direction of polarization different from the first direction of polarization to make the directions of polarization different between the respective areas.

In the optical information recording apparatus of the invention, the recording-specific reference light generation means may generate recording-specific reference light having a spatially modulated phase. In this case, the recording-specific reference light may have such a modulation pattern that a pattern which is point-symmetric to the modulation pattern about the position of an optical axis of the optical system for irradiating the information recording layer with the recording-specific reference light is not the same as the modulation pattern.

In the optical information recording method of the invention, in the recording step, each of the recording-specific reference light having a predetermined first direction of polarization and the information light having a second direction of polarization different from the first direction of polarization may be optically rotated in directions different between the respective areas to make the directions of polarization different between the respective areas.

In the optical information recording method of the invention, the step of generating recording-specific reference light may generate recording-specific reference light having a spatially modulated phase. In this case, the recording-specific reference light may have such a modulation pattern that a pattern which is point-symmetric to the modulation pattern about the position of an optical axis of the optical system for irradiating the information recording layer with the recording-specific reference light is not the same as the modulation pattern.

An optical information reproducing apparatus of the invention is an apparatus for reproducing information through the use of holography from an optical information recording medium having an information recording layer in which information is recorded through the use of holography and one side of which is irradiated with light for recording or reproducing information, and a reflecting surface disposed on the other side of the information recording layer, the information being recorded in the information recording layer based on information light and recording-specific reference light that are projected coaxially onto the one side of the information recording layer such that they converge on the reflecting surface, in the form of an interference pattern resulting from interference between the information light yet to impinge on the reflecting surface and the recording-specific reference light reflected by the reflecting surface and an interference pattern resulting from interference between the recording-specific reference light yet to impinge on the reflecting surface and the information light reflected by the reflecting surface, the apparatus comprising:

reproduction-specific reference light generation means for generating reproduction-specific reference light;

a reproducing optical system for irradiating the information recording layer with the reproduction-specific reference light generated by the reproduction-specific reference light generation means and for collecting reproduction light generated at the information recording layer when irradiated with the reproduction-specific reference light; and detection means for detecting the reproduction light collected by the reproducing optical system, wherein the reproducing optical system projects the reproduction-specific reference light onto the information recording layer to allow it to converge on the reflecting surface, such that the irradiation with the reproduction-specific reference light and the collection of the reproduction light are performed on the one side, and that the reproduction-specific reference light and the reproduction light are arranged coaxially, and the recording optical system has optical rotation means for optically rotating light passing therethrough in directions different between respective half areas of a cross section of the beam of the light, and optically rotates, with the optical rotation means, the reproduction-specific reference light having a predetermined first direction of polarization to convert the same into reproduction-specific reference light having directions of polarization different between the respective areas to irradiate the information recording layer therewith, and optically rotates, with the optical rotation means, the reproduction light and return light resulting from the reproduction-specific reference light reflected by the reflecting surface to convert them into reproduction light having the first direction of polarization over an entire cross section of a beam thereof and return light having a second direction of polarization different from the first direction of polarization over an entire cross section of a beam thereof.

An optical information reproducing method of the invention is a method for reproducing information through the use of holography from an optical information recording medium having an information recording layer in which information is recorded through the use of holography and one side of which is irradiated with light for recording or reproducing information, and a reflecting surface disposed on the other side of the information recording layer, the information being recorded in the information recording layer based on information light and recording-specific reference light that are projected coaxially onto the one side of the information recording layer such that they converge on the reflecting surface, in the form of an interference pattern resulting from interference between the information light yet to impinge on the reflecting surface and the recording-specific reference light reflected by the reflecting surface and an interference pattern resulting from interference between the recording-specific reference light yet to impinge on the reflecting surface and the information light reflected by the reflecting surface, the method comprising:

the step of generating reproduction-specific reference light;

the reproducing step in which the information recording layer is irradiated with the reproduction-specific reference light generated by the reproduction-specific reference light generation means, and reproduction light generated at the information recording layer when irradiated with the reproduction-specific reference light is collected; and the step of detecting the reproduction light, wherein in the reproducing step, the reproduction-specific reference light is projected onto the information recording layer so as to converge on the reflecting surface such that the irradiation with the reproduction-specific reference light and the collection of the reproduction light are performed on the one side, and that the reproduction-specific reference light and the reproduction light are arranged coaxially, and in the reproducing step, the reproduction-specific reference light having a predetermined first direction of polarization is optically rotated in directions different between respective half areas of a cross section of a beam thereof, and thereby converted into reproduction-specific reference light having directions of polarization different between the respective areas to irradiate the information recording layer therewith, and the reproduction light and return light resulting from the reproduction-specific reference light reflected by the reflecting surface are each optically rotated in directions different between the respective areas and thereby converted into reproduction light having the first direction of polarization over an entire cross section of a beam thereof and return light having a second direction of polarization different from the first direction of polarization over an entire cross section of a beam thereof.

In the optical information reproducing apparatus or the optical information reproducing method of the invention, the reproduction-specific reference light is projected onto the information recording layer so as to converge on the reflecting surface. The projection of the reproduction-specific reference light and the collection of the reproduction light are performed on the one side, and the reproduction-specific reference light and the reproduction light are arranged coaxially. The reproduction-specific reference light having a predetermined first direction of polarization is optically rotated in directions different between respective half areas of a cross section of the beam thereof, and thereby converted into reproduction-specific reference light having directions of polarization different between the respective areas to irradiate the information recording layer therewith, and the reproduction light and the return light are each optically rotated in directions different between the respective areas and thereby converted into reproduction light having the first direction of polarization over the entire cross section of the beam thereof and return light having a second direction of polarization over the entire cross section of the beam thereof.

In the optical information reproducing apparatus of the invention, the reproducing optical system may further have polarization separation means for separating the reproduction light having passed through the optical rotation means and the return light having passed through the optical rotation means from each other depending on a difference in direction of polarization.

In the optical information reproducing apparatus of the invention, the reproduction-specific reference light generation means may generate reproduction-specific reference light having a spatially modulated phase. In this case, the reproduction-specific reference light may have such a modulation pattern that a pattern which is point-symmetric to the modulation pattern about the position of an optical axis of the optical system for irradiating the information recording layer with the reproduction-specific reference light is not the same as the modulation pattern.

In the optical information reproducing method of the invention, the reproducing step may separate the reproduction light that has been optically rotated and the return light that has been optically rotated from each other depending on a difference in direction of polarization.

In the optical information reproducing method of the invention, the step of generating reproduction-specific reference light may generate reproduction-specific reference light having a spatially modulated phase. In this case, the reproduction-specific reference light may have such a modulation pattern that a pattern which is point-symmetric to the modulation pattern about the position of an optical axis of the optical system for irradiating the information recording layer with the reproduction-specific reference light is not the same as the modulation pattern.

An optical information recording/reproducing apparatus of the invention is an apparatus for recording information in an optical information recording medium having an information recording layer in which information is recorded through the use of holography and one side of which is irradiated with light for recording or reproducing information, and a reflecting surface disposed on the other side of the information recording layer, and for reproducing information from the optical information recording medium, the apparatus comprising:

information light generation means for generating information light that carries information;

recording-specific reference light generation means for generating recording-specific reference light;

reproduction-specific reference light generation means for generating reproduction-specific reference light;

a recording/reproducing optical system for, to record information, irradiating the information recording layer with the information light generated by the information light generation means and the recording-specific reference light generated by the recording-specific reference light generation means such that information is recorded in the information recording layer in the form of an interference pattern resulting from interference between the information light and the recording-specific reference light, and, to reproduce information, irradiating the information recording layer with the reproduction-specific reference light generated by the reproduction-specific reference light generation means and collecting reproduction light generated at the information recording layer when irradiated with the reproduction-specific reference light; and detection means for detecting the reproduction light collected by the recording/reproducing optical system, wherein the recording/reproducing optical system has optical rotation means for optically rotating light passing therethrough in directions different between respective half areas of a cross section of a beam of the light, to record information, the recording/reproducing optical system projects the information light and the recording-specific reference light coaxially onto the one side of the information recording layer such that they converge on the reflecting surface, to record information, the recording/reproducing optical system optically rotates, with the optical rotation means, each of the recording-specific reference light having a predetermined first direction of polarization and the information light having a second direction of polarization different from the first direction of polarization to cause each of the information light and the recording-specific reference light to have directions of polarization that are different between the respective areas such that the direction of polarization of the information light yet to impinge on the reflecting surface coincides with that of the recording-specific reference light reflected by the reflecting surface, and the direction of polarization of the recording-specific reference light yet to impinge on the reflecting surface coincides with that of the information light reflected by the reflecting surface, to reproduce information, the recording/reproducing optical system projects the reproduction-specific reference light onto the information recording layer to allow it to converge on the reflecting surface, such that the irradiation with the reproduction-specific reference light and the collection of the reproduction light are performed on the one side, and that the reproduction-specific reference light and the reproduction light are arranged coaxially, and to reproduce information, the recording/reproducing optical system optically rotates, with the optical rotation means, the reproduction-specific reference light having the first direction of polarization to convert the same into reproduction-specific reference light having directions of polarization different between the respective areas to irradiate the information recording layer therewith, and optically rotates, with the optical rotation means, the reproduction light and return light resulting from the reproduction-specific reference light reflected by the reflecting surface to convert them into reproduction light having the first direction of polarization over an entire cross section of a beam thereof and return light having a second direction of polarization different from the first direction of polarization over an entire cross section of a beam thereof.

An optical information recording/reproducing method of the invention is a method for recording information in an optical information recording medium having an information recording layer in which information is recorded through the use of holography and one side of which is irradiated with light for recording or reproducing information, and a reflecting surface disposed on the other side of the information recording layer, and for reproducing information from the optical information recording medium, the method comprising:

the step of generating information light that carries information;

the step of generating recording-specific reference light;

the recording step in which the information recording layer is irradiated with the information light and the recording-specific reference light such that the information is recorded in the information recording layer in the form of an interference pattern resulting from interference between the information light and the recording-specific reference light;

the step of generating reproduction-specific reference light;

the reproducing step in which the information recording layer is irradiated with the reproduction-specific reference light, and reproduction light generated at the information recording layer when irradiated with the reproduction-specific reference light is collected; and the step of detecting the reproduction light, wherein in the recording step, the information light and the recording-specific reference light are projected coaxially onto the one side of the information recording layer such that they converge on the reflecting surface, in the recording step, each of the recording-specific reference light having a predetermined first direction of polarization and the information light having a second direction of polarization different from the first direction of polarization is optically rotated in directions different between respective half areas of a cross section of a beam thereof to cause each of the information light and the recording-specific reference light to have directions of polarization different between the respective areas such that the direction of polarization of the information light yet to impinge on the reflecting surface coincides with that of the recording-specific reference light reflected by the reflecting surface, and the direction of polarization of the recording-specific reference light yet to impinge on the reflecting surface coincides with that of the information light reflected by the reflecting surface, in the reproducing step, the reproduction-specific reference light is projected onto the information recording layer so as to converge on the reflecting surface, such that the irradiation with the reproduction-specific reference light and the collection of the reproduction light are performed on the one side, and that the reproduction-specific reference light and the reproduction light are arranged coaxially, and in the reproducing step, the reproduction-specific reference light having a predetermined first direction of polarization is optically rotated in directions different between respective half areas of a cross section of a beam thereof, and thereby converted into reproduction-specific reference light having directions of polarization different between the respective areas to irradiate the information recording layer therewith, and the reproduction light and return light resulting from the reproduction-specific reference light reflected by the reflecting surface are each optically rotated in directions different between the respective areas and thereby converted into reproduction light having the first direction of polarization over an entire cross section of a beam thereof and return light having a second direction of polarization different from the first direction of polarization over an entire cross section of a beam thereof.

In the optical information recording/reproducing apparatus or the optical information recording/reproducing method of the invention, to record information, the information light and the recording-specific reference light are projected coaxially onto one side of the information recording layer so as to converge on the reflecting surface. In the optical information recording layer, the direction of polarization of the information light yet to impinge on the reflecting surface coincides with that of the recording-specific reference light reflected by the reflecting surface, so that an interference pattern resulting from interference therebetween is recorded. On the other hand, the direction of polarization of the recording-specific reference light yet to impinge on the reflecting surface coincides with that of the information light reflected by the reflecting surface, so that an interference pattern resulting from interference therebetween is recorded. To reproduce information, the reproduction-specific reference light is projected onto the information recording layer so as to converge on the reflecting surface. The projection of the reproduction-specific reference light and the collection of the reproduction light are performed on the one side, and the reproduction-specific reference light and the reproduction light are arranged coaxially. The reproduction-specific reference light having a predetermined first direction of polarization is optically rotated in directions different between respective half areas of a cross section of the beam thereof, and thereby converted into reproduction-specific reference light having directions of polarization different between the respective areas to irradiate the information recording layer therewith, and the reproduction light and return light are each optically rotated in directions different between the respective areas and thereby converted into reproduction light having the first direction of polarization over the entire cross section of the beam thereof and return light having a second direction of polarization over the entire cross section of the beam thereof.

In the optical information recording/reproducing apparatus of the invention, the recording/reproducing optical system may further have polarization separation means for separating the reproduction light having passed through the optical rotation means and the return light having passed through the optical rotation means from each other depending on a difference in direction of polarization.

In the optical information recording/reproducing apparatus of the invention, the recording-specific reference light generation means may generate recording-specific reference light having a spatially modulated phase, and the reproduction-specific reference light generation means may generate reproduction-specific reference light having a spatially modulated phase. In this case, the recording-specific reference light and the reproduction-specific reference light may each have such a modulation pattern that a pattern which is point-symmetric to the modulation pattern about the position of an optical axis of the optical system for irradiating the information recording layer with the recording-specific reference light and the reproduction-specific reference light is not the same as the modulation pattern.

In the optical information recording/reproducing method of the invention, the reproducing step may separate the reproduction light that has been optically rotated and the return light that has been optically rotated from each other depending on a difference in direction of polarization.

In the optical information recording/reproducing method of the invention, the step of generating recording-specific reference light may generate recording-specific reference light having a spatially modulated phase, and the step of generating reproduction-specific reference light may generate reproduction-specific reference light having a spatially modulated phase. In this case, the recording-specific reference light and the reproduction-specific reference light may each have such a modulation pattern that a pattern which is point-symmetric to the modulation pattern about the position of an optical axis of the optical system for irradiating the information recording layer with the recording-specific reference light and the reproduction-specific reference light is not the same as the modulation pattern.

Other objects, features and advantages of the invention will become sufficiently clear from the following description.

BRIEF DESCRIPTION OF THE DRAWINGS

The following detailed description, given by way of example and not intended to limit the present invention solely thereto, will best be appreciated in conjunction with the accompanying drawings, wherein like reference numerals denote like elements and parts.

DETAILED DESCRIPTION OF CERTAIN PREFERRED EMBODIMENTS OF THE INVENTION

Hereinafter, an embodiment of the invention will be described in detail with reference to the drawings.

Figure 1:
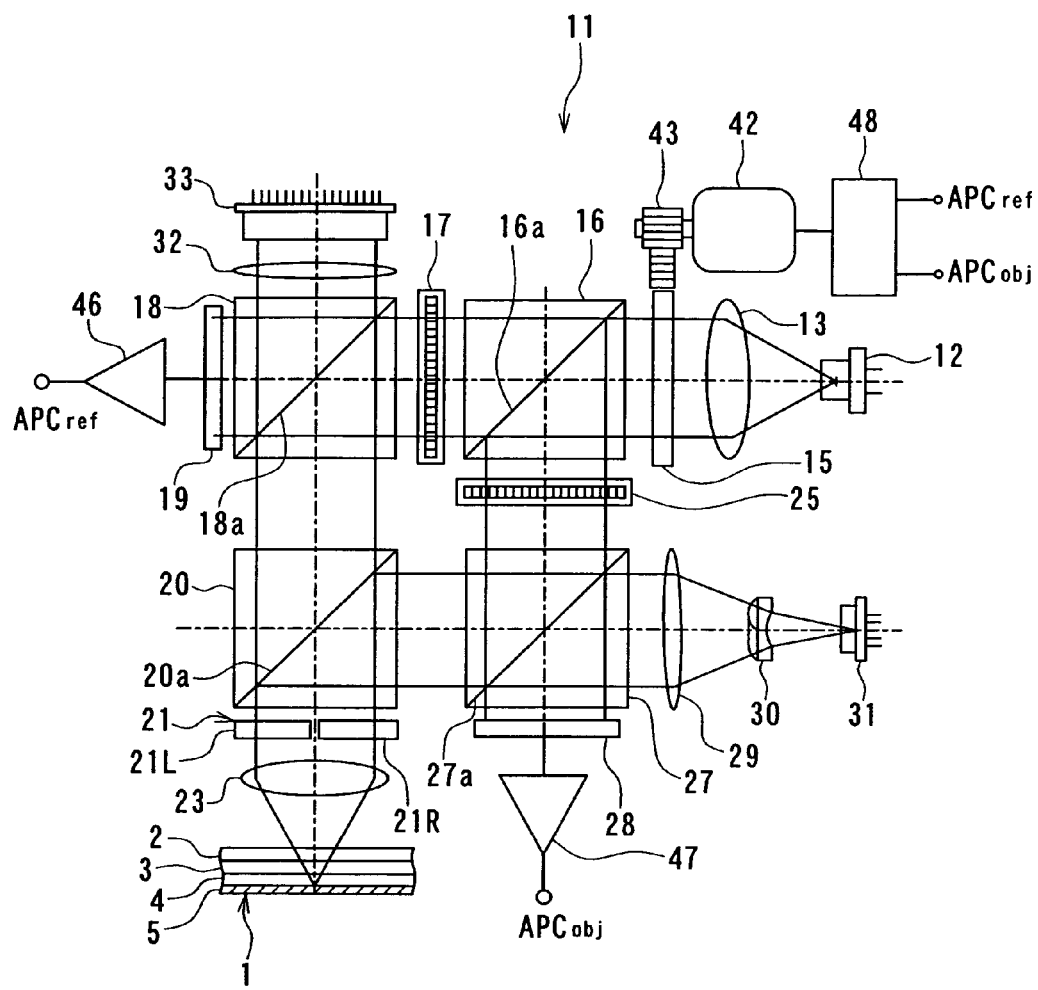
FIG. 1 is an explanatory diagram illustrating a configuration of a pick-up of an optical information recording/reproducing apparatus according to an embodiment of the invention.
Figure 2:
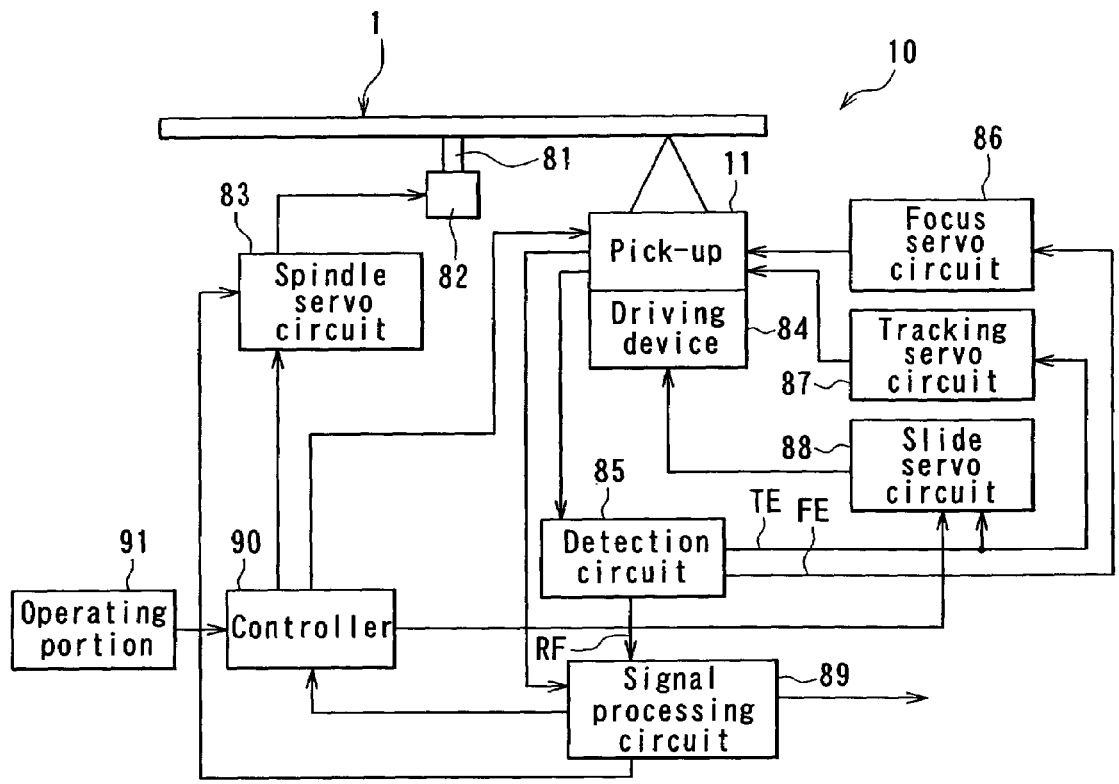
FIG. 2 is a block diagram illustrating a general configuration of the optical information recording/reproducing apparatus according to the embodiment of the invention.

First, with reference to FIG. 1 and FIG. 2, description will be given of a configuration of an optical information recording/reproducing apparatus acting as an optical information recording apparatus and an optical information reproducing apparatus according to the embodiment of the invention. FIG. 1 is an explanatory diagram illustrating a configuration of a pick-up of the optical information recording/reproducing apparatus according to the present embodiment. FIG. 2 is a block diagram illustrating a general configuration of the optical information recording/reproducing apparatus according to the embodiment.

First, with reference to FIG. 1, description will be given of a configuration of an optical information recording medium used in the present embodiment. The optical information recording medium 1 of the embodiment comprises a disk-like transparent substrate 2 made of polycarbonate or the like, and an information recording layer 3, a transparent substrate 4, and a reflecting layer 5 that are arranged in this order from the transparent substrate 2, on a side of the transparent substrate 2 opposite from the light incident/emergent side. The transparent substrate 4 may be replaced with an air gap layer. The information recording layer 3 is a layer in which information is recorded through the use of holography, and is made of a hologram material which varies, when irradiated with light, in its optical characteristics such as refractive index, permittivity, and reflectance, depending on the intensity of the light. For example, hologram materials such as photopolymer HRF-600 (product name) manufactured by Dupont and photopolymer ULSH-500 (product name) manufactured by Aprils may be used. The reflecting layer 5 is made of aluminum, for example. Incidentally, in the optical information recording medium 1, the information recording layer 3 and the reflecting layer 5 may be arranged next to each other without the transparent substrate 4.

The surface of the reflecting layer 5 facing the transparent substrate 4 serves as a reflecting surface for reflecting light for recording or reproducing information. Although not shown, a plurality of address servo areas serving as positioning areas and extending linearly in radial directions are provided at predetermined angular intervals on the reflecting surface. Sections in the form of sectors between adjacent ones of the address servo areas serve as data areas. In the address servo areas, information for performing focus servo and tracking servo under a sampled servo system and address information are recorded in advance in the form of emboss pits or the like. The focus servo can be performed by using the reflecting surface of the reflecting layer 5. For example, wobble pits may be used as the information for performing tracking servo.

Next, the configuration of the optical information recording/reproducing apparatus according to the embodiment will be described with reference to FIG. 2. The optical information recording/reproducing apparatus 10 has: a spindle 81 on which the optical information recording medium 1 is mounted; a spindle motor 82 for rotating the spindle 81; and a spindle servo circuit 83 for controlling the spindle motor 82 to keep the rotation speed of the optical information recording medium 1 at a predetermined value. The optical information recording/reproducing apparatus 10 further has: a pick-up 11 for irradiating the optical information recording medium 1 with information light and recording-specific reference light to record information therein, and irradiating the optical information recording medium 1 with reproduction-specific reference light to detect reproduction light to thereby reproduce information recorded in the optical information recording medium 1; and a driving device 84 for allowing the pick-up 11 to move in a direction of the radius of the optical information recording medium 1.

The optical information recording/reproducing apparatus 10 further has: a detection circuit 85 for detecting a focus error signal FE, a tracking error signal TE and a reproduction signal RF from a signal outputted from the pick-up 11; and a focus servo circuit 86 for performing focus servo by driving an actuator in the pick-up 11 based on the focus error signal FE detected by the detection circuit 85 to move an objective lens in a direction of the thickness of the optical information recording medium 1. The optical information recording/reproducing apparatus 10 further has: a tracking servo circuit 87 for performing tracking servo by driving the actuator in the pick-up 11 based on the tracking error signal TE detected by the detection circuit 85 to move the objective lens in a direction of the radius of the optical information recording medium 1; and a slide servo circuit 88 for performing slide servo by controlling the driving device 84 based on the tracking error signal TE and a command from a controller to be described later to move the pick-up 11 in a direction of the radius of the optical information recording medium 1.

The optical information recording/reproducing apparatus 10 further has: a signal processing circuit 89 for reproducing data recorded in the data areas 7 of the optical information recording medium 1 by decoding data outputted by a CCD array to be described later in the pick-up 11 and for reproducing a basic clock and determining addresses from the reproduction signal RF from the detection circuit 85; a controller 90 for controlling the optical information recording/reproducing apparatus 10 as a whole; and an operating portion 91 for supplying various instructions to the controller 90. The controller 90 receives input of the basic clock and address information outputted by the signal processing circuit 89 and controls the pick-up 11, the spindle servo circuit 83, the slide servo circuit 88 and the like. The basic clock outputted by the signal processing circuit 89 is inputted to the spindle servo circuit 83. The controller 90 has a CPU (central processing unit), a ROM (read only memory) and a RAM (random access memory), and the CPU executes programs stored in the ROM using the RAM as a work area to perform the functions of the controller 90.

A configuration of the pick-up 11 of the embodiment will now be described with reference to FIG. 1. The pick-up 11 includes a light source device 12 that emits coherent linearly polarized laser light, and a collimator lens 13, a rotation-causing optical element 15, a polarization beam splitter 16, a phase spatial light modulator 17, a beam splitter 18, and a photodetector 19 that are arranged in this order from the light source device 12 in a traveling direction of the light emitted from the light source device 12.

The light source device 12 emits S-polarized or P-polarized linear light. The collimator lens 13 collimates the light emitted by the light source device 12 to emit parallel beams thereof. The rotation-causing optical element 15 optically rotates the light emitted by the collimator lens 13 to emit light including S-polarized components and P-polarized components. S-polarized light refers to linear polarized light whose direction of polarization is perpendicular to the incidence plane (plane of the drawing sheet of FIG. 1). P-polarized light refers to linear polarized light whose direction of polarization is parallel to the incidence plane. For example, a half-wave plate or an optical rotation plate is used as the rotation-causing optical element 15.

The polarization beam splitter 16 has a polarization beam splitter surface 16a that reflects the S-polarized components of the light emergent from the rotation-causing optical element 15 and transmits the P-polarized components thereof. The phase spatial light modulator 17 has a number of pixels arranged in a matrix, and is capable of spatially modulating the phase of light by selecting the phase of emergent light pixel by pixel. A liquid crystal element may be used as the phase spatial light modulator 17.

The beam splitter 18 has a beam splitter surface 18a. For example, the beam splitter surface 18a transmits 20% of the P-polarized components and reflects 80% of the same. The photodetector 19 is used to monitor the quantity of reference light for performing automatic power control (hereinafter referred to as APC) over the reference light. A light-receiving portion of the photodetector 19 may be divided into a plurality of areas to allow adjustment of the intensity distribution of the reference light.

The pick-up 11 further has a polarization beam splitter 20, a two-way split optical rotation plate (two-way split gyrator) 21 and a objective lens 23 that are arranged in this order from the beam splitter 18 in a direction in which the light from the light source device 12 travels after being reflected by the beam splitter surface 18a of the beam splitter 18.

The polarization beam splitter 20 has a polarization beam splitter surface 20a for reflecting S-polarized components of light incident thereon and for transmitting P-polarized components thereof. The polarization beam splitter 20 corresponds to the polarization separation means of the invention.

The two-way split optical rotation plate 21 has optical rotation plates 21L and 21R disposed on the left side and the right side, respectively, of the optical axis as viewed in FIG. 1. The optical rotation plate 21R causes a −45° rotation of the direction of polarization, while the optical rotation plate 21L causes a +45° rotation of the direction of polarization. The two-way split optical rotation plate 21 corresponds to the optical rotation means of the invention.

The objective lens 23 faces toward the transparent substrate 2 of the optical information recording medium 1 when the optical information recording medium 1 is secured to the spindle 81. The pick-up 11 further has an actuator (not shown) that is capable of moving the objective lens 23 in a direction of the thickness of the optical information recording medium 1 and in a direction of the tracks.

The pick-up 11 further has a spatial light modulator 25, a beam splitter 27, and a photodetector 28 that are arranged in this order from the polarization beam splitter 16 in a direction in which the light from the light source device 12 travels after being reflected by the polarization beam splitter surface 16a of the polarization beam splitter 16.

The spatial light modulator 25 has a number of pixels arranged in a matrix, and is capable of generating information light that carries information by spatially modulating light in terms of intensity by selecting a light-transmitting state or a light-blocking state for each of the pixels. A liquid crystal element may be used as the spatial light modulator 25.

The beam splitter 27 has a beam splitter surface 27a. For example, the beam splitter surface 27a transmits 20% of S-polarized components and reflects 80% of the same. The photodetector 28 is used to monitor the quantity of the information light to thereby perform APC on the information light. The light-receiving portion of the photodetector 28 may be divided into a plurality of areas to allow adjustment of the intensity distribution of the information light. Light that is incident on the beam splitter 27 from the side of the spatial light modulator 25 and reflected by the beam splitter surface 27a is to be incident on the polarization beam splitter 20.

The pick-up 11 further has a convex lens 29, a cylindrical lens 30, and a four-way split photodetector 31 that are arranged in this order from the beam splitter 27, on a side of the beam splitter 27 opposite to the polarization beam splitter 20. The four-way split photodetector 31 has four light-receiving portions divided by a division line that is parallel to a direction corresponding to the direction of tracks of the optical information recording medium 1 and a division line that is orthogonal thereto. The cylindrical lens 30 is provided such that the central axis of the cylindrical surface thereof is at an angle of 45° to the division lines of the four-way split photodetector 31.

The pick-up 11 further has an imaging lens 32 and a CCD array 33 that are arranged in this order from the beam splitter 18, on a side of the beam splitter 18 opposite to the polarization beam splitter 20. The CCD array 33 corresponds to the detection means of the invention.

The pick-up 11 further has an APC circuit 46 connected to the photodetector 19, and an APC circuit 47 connected to the photodetector 28. The APC circuit 46 amplifies the output of the photodetector 19 to generate a signal $APC_{ref}$ used for APC to be performed on the reference light. The APC circuit 47 amplifies the output of the photodetector 28 to generate a signal $APC_{obj}$ used for APC to be performed on the information light.

In order to adjust a ratio between the S-polarized components and P-polarized components of the light emergent from the rotation-causing optical element 15, the pick-up 11 further has a motor 42, a gear 43 for transmitting the rotation of an output axis of the motor 42 to the rotation-causing optical element 15, and a driving circuit 48 for driving the motor 42. The driving circuit 48 compares the respective signals $APC_{ref}$ and $APC_{obj}$ of APC circuits 46 and 47 with each other, and drives the motor 42 so that the ratio between the S-polarized components and P-polarized components of the light emergent from the rotation-causing optical element 15 is optimized.

The light source device 12, the phase spatial light modulator 17 and the spatial light modulator 25 in the pick-up 11 are controlled by the controller 90 shown in FIG. 2. The controller 90 holds information on a plurality of modulation patterns for spatially modulating the phase of light with the phase spatial light modulator 17. The operating portion 91 allows selection of any one of the plurality of modulation patterns. Then, the controller 90 supplies the information on the modulation pattern selected by itself or by the operating portion 91 to the phase spatial light modulator 17 in accordance with predetermined conditions. In accordance with the information on the modulation pattern supplied by the controller 90, the phase spatial light modulator 17 spatially modulates the phase of light in the corresponding modulation pattern.

Figure 3:
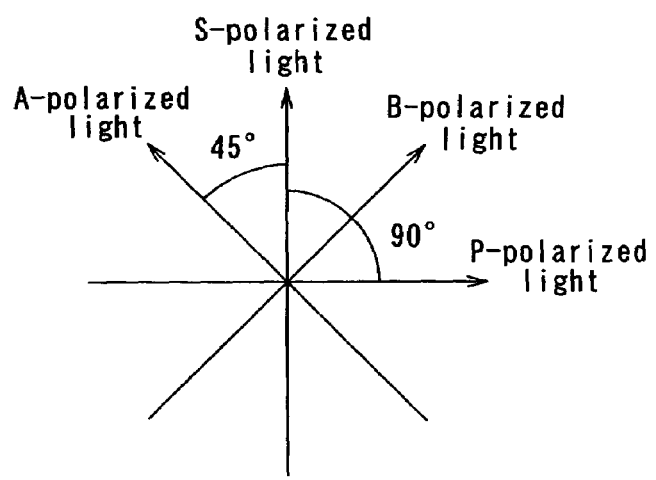
FIG. 3 is an explanatory diagram for explaining polarized light used in the embodiment of the invention.

Now, with reference to FIG. 3, definitions will be given to terms "A-polarized light" and "B-polarized light" which will be used later in this description. As shown in FIG. 3, A-polarized light is linear polarized light obtained by rotating the direction of polarization of the S-polarized light by −45° or by rotating the direction of polarization of the P-polarized light by +45°, while B-polarized light is linear polarized light obtained by rotating the direction of polarization of the S-polarized light by +45° or by rotating the direction of polarization of the P-polarized light by −45°. The directions of polarization of the A-polarized light and B-polarized light are orthogonal to each other.

Servo, recording, and reproducing operations of the optical information recording/reproducing apparatus according to the embodiment will now be separately described in that order. The following description also serves to describe the optical information recording method, the optical information reproducing method, and the optical information recording/reproducing method according to the embodiment.

Figure 4:
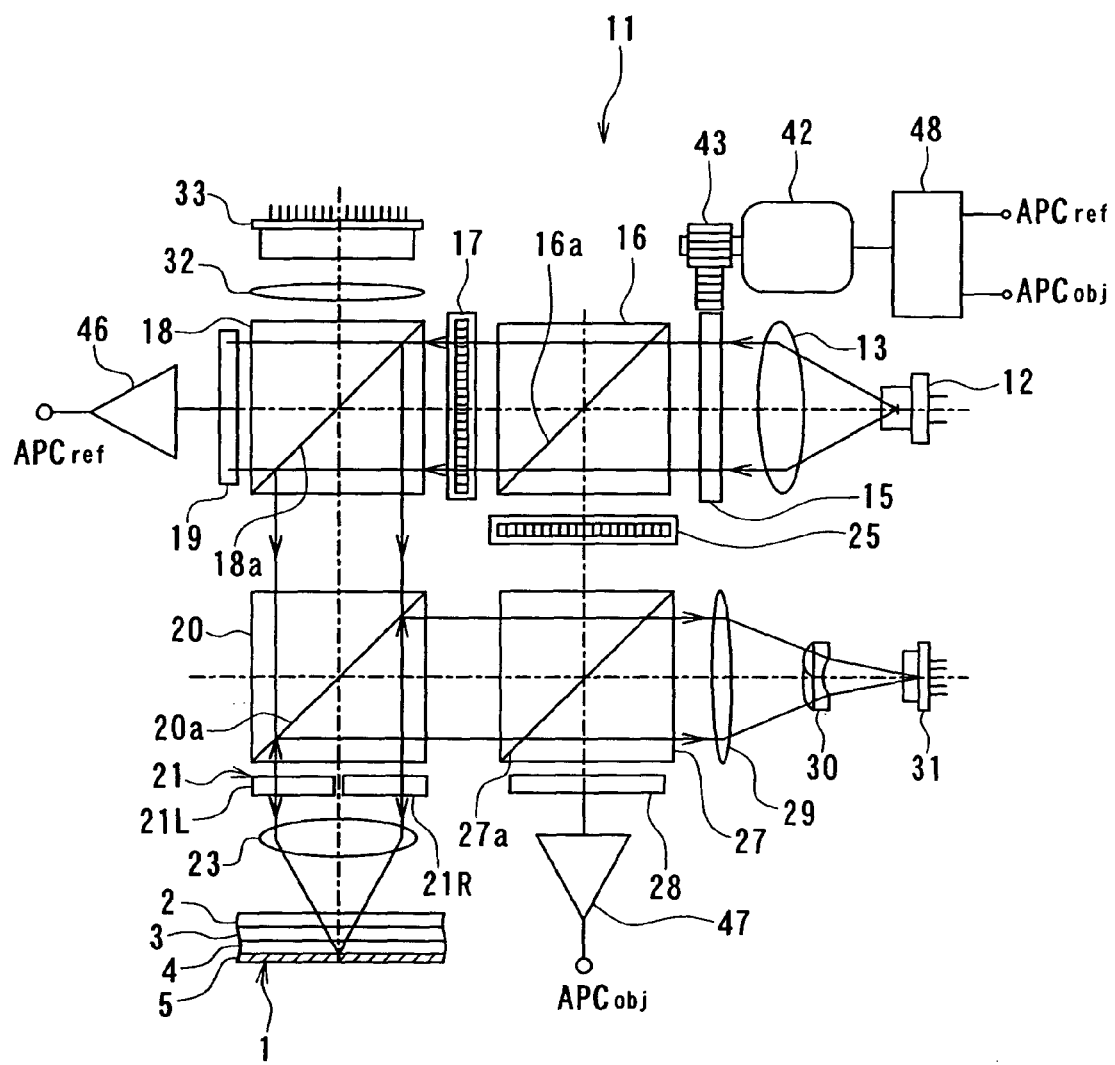
FIG. 4 is an explanatory diagram illustrating a state of the pick-up during a servo operation in the embodiment of the invention.

The servo operation will now be described with reference to FIG. 4. FIG. 4 is an explanatory diagram illustrating a state of the pick-up 11 during the servo operation. During the servo operation, all the pixels of the spatial light modulator 25 are brought into a blocking state. The phase spatial light modulator 17 is set such that light passing through each of the pixels thereof has the same phase as each other. The output of light emitted by the light source device 12 is set to a low level suitable for reproduction. The controller 90 predicts the timing at which light emergent from the objective lens 23 passes through the address servo areas based on a basic clock reproduced from a reproduction signal RF, and maintains the foregoing setting while the light emergent from the objective lens 23 passes through the address servo areas.

The light emitted by the light source device 12 is collimated by the collimator lens 13 and passes through the rotation-causing optical element 15 to be incident on the polarization beam splitter 16. S-polarized components of the light incident on the polarization beam splitter 16 are reflected by the polarization beam splitter surface 16a and are blocked by the spatial light modulator 25. P-polarized components of the light incident on the polarization beam splitter 16 are transmitted by the polarization beam splitter surface 16a and pass through the phase spatial light modulator 17 to be incident on the beam splitter 18. Part of the light incident on the beam splitter 18 is reflected by the beam splitter surface 18a and passes through the polarization beam splitter 20 to be incident on the two-way split optical rotation plate 21. Here, light that has passed through the optical rotation plate 21R of the two-way split optical rotation plate 21 becomes B-polarized light, while light that has passed through the optical rotation plate 21L becomes A-polarized light. The light having passed through the two-way split optical rotation plate 21 is collected by the objective lens 23, is projected onto the optical information recording medium 1, and converges to a minimum diameter on the reflecting surface of the optical information recording medium 1. This light is reflected by the reflecting surface, at which time it is modulated by pits formed on the reflecting surface and returns to the objective lens 23.

The return light from the optical information recording medium 1 is collimated by the objective lens 23 and passes through the two-way split optical rotation plate 21 to become S-polarized light. That is, the light passing through the optical rotation plate 21R before impinging on the information recording medium 1 is B-polarized light, and this light passes through the optical rotation plate 21L after being reflected by the reflecting surface of the optical information recording medium 1 to become S-polarized light. On the other hand, the light passing through the optical rotation plate 21L before impinging on the information recording medium 1 is A-polarized light, and this light passes through the optical rotation plate 21R after being reflected by the reflecting surface of the optical information recording medium 1 to become S-polarized light. Thus, the return light is reflected by the polarization beam splitter surface 20a of the polarization beam splitter 20. This return light impinges on the beam splitter 27, and part of the light is transmitted by the beam splitter surface 27a and passes through the convex lens 29 and the cylindrical lens 30 sequentially to be detected by the four-way split photodetector 31. Based on the output of the four-way split photodetector 31, the detection circuit 85 generates a focus error signal FE, a tracking error signal TE, and a reproduction signal RF. Based on these signals, focus servo and tracking servo are performed, along with reproduction of the basic clock and determination of addresses.

Part of the light incident on the beam splitter 18 impinges on the photodetector 19. Based on signals outputted by the photodetector 19, the APC circuit 46 generates a signal $APC_{ref}$. Then, APC is performed based on the signal $APC_{ref}$ such that the optical information recording medium 1 is irradiated with a constant quantity of light. Specifically, the driving circuit 48 drives the motor 42 to adjust the rotation-causing optical element 15 such that the signal $APC_{ref}$ equals a predetermined value. Alternatively, during the servo operation, APC may be performed by setting the rotation-causing optical element 15 such that light which has passed through the rotation-causing optical element 15 has P-polarized components only, and by adjusting the output of the light source device 12. When the light-receiving portion of the photodetector 19 is divided into a plurality of areas and the phase spatial light modulator 17 is capable of also adjusting the quantity of light transmitted thereby, the light to be projected onto the optical information recording medium 1 may be adjusted to have a uniform intensity distribution by adjusting the quantity of light transmitted by each pixel of the phase spatial light modulator 17 based on a signal outputted by each of the light-receiving portions of the photodetector 19.

For the above-described setting for the servo operation, the configuration of the pick-up 11 is the same as that of a pick-up for recording and reproduction on a typical optical disk. Therefore, the optical information recording/reproducing apparatus of the embodiment allows recording and reproduction using a typical optical disk.

Figure 5:
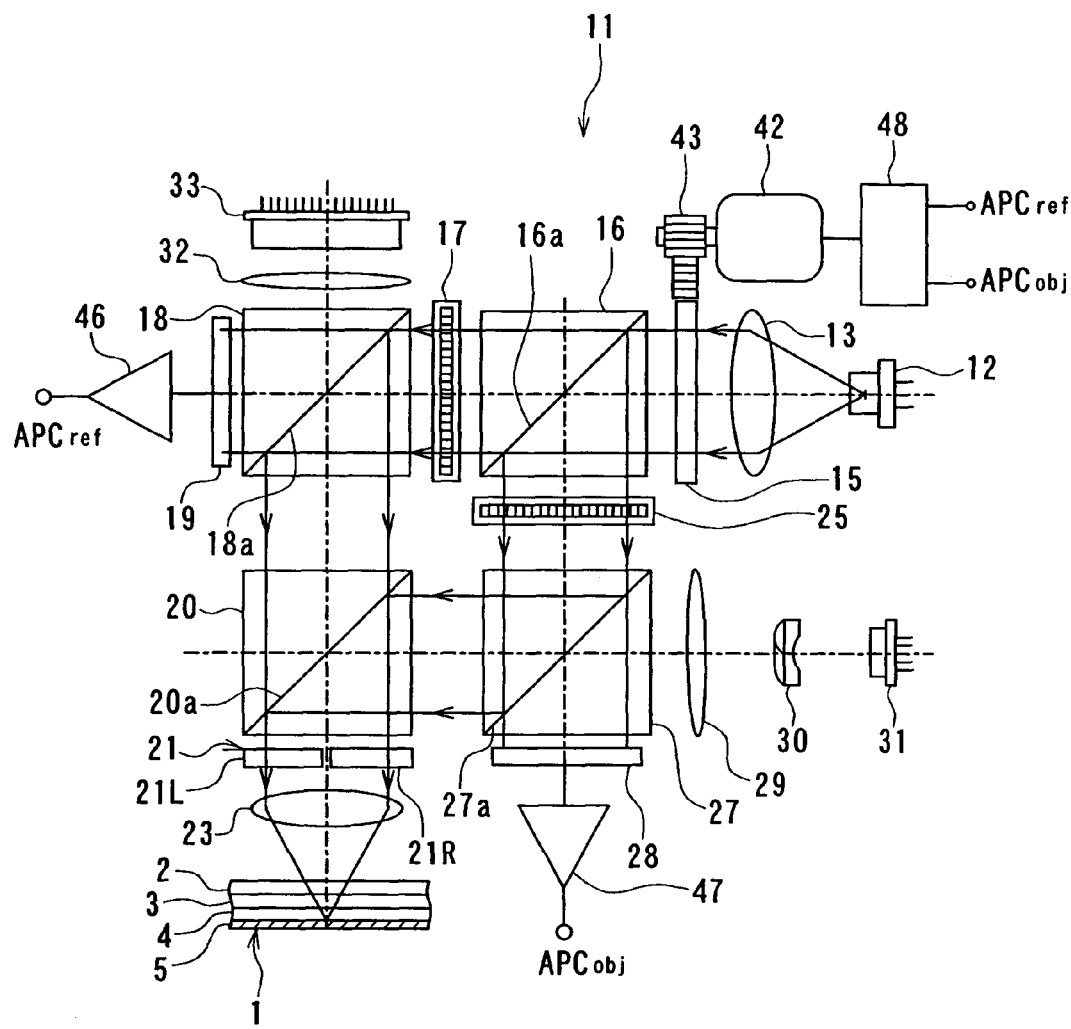
FIG. 5 is an explanatory diagram illustrating a state of the pick-up during a recording operation in the embodiment of the invention.
Figure 6:
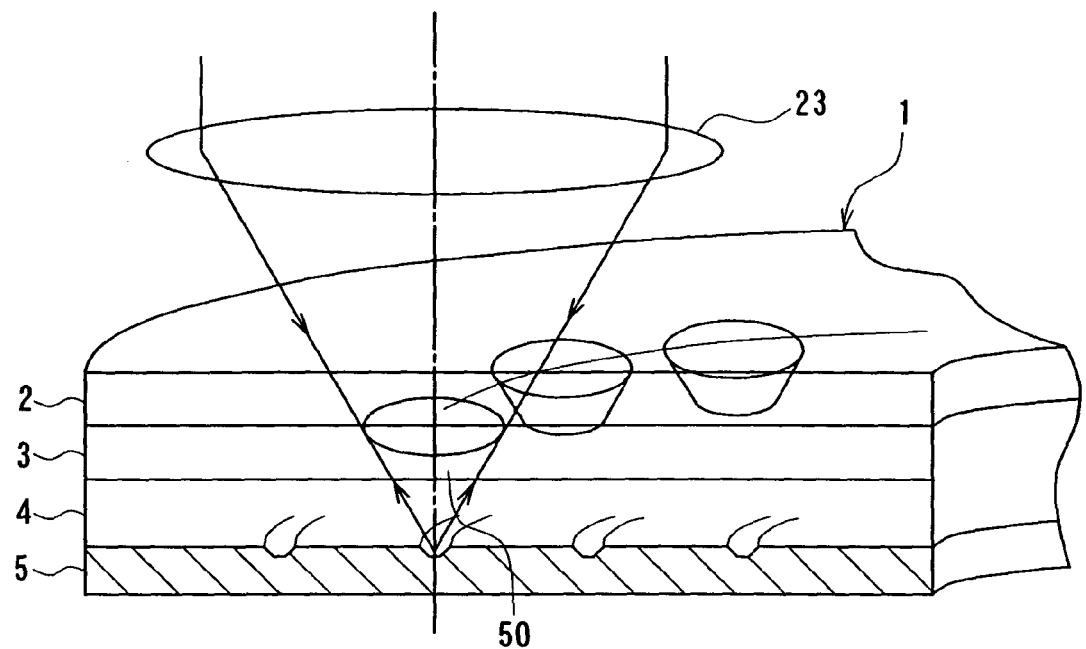
FIG. 6 is an explanatory diagram illustrating a state of light in the vicinity of the optical information recording medium during the recording operation in the embodiment of the invention.
Figure 7:
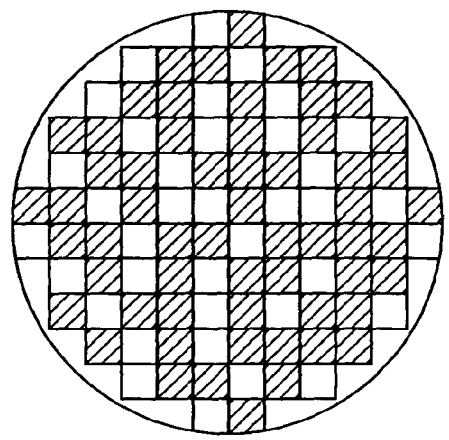
FIG. 7 is an explanatory diagram illustrating an example of a pattern of information light in the embodiment of the invention.
Figure 8:
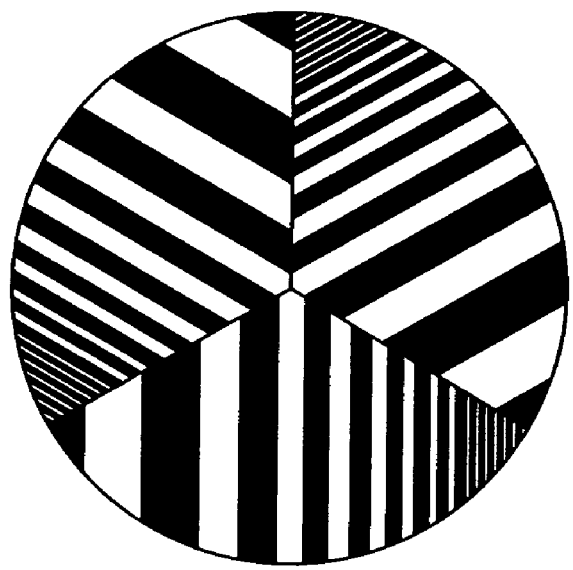
FIG. 8 is an explanatory diagram illustrating an example of a modulation pattern of recording-specific reference light in the embodiment of the invention.
Figure 9:
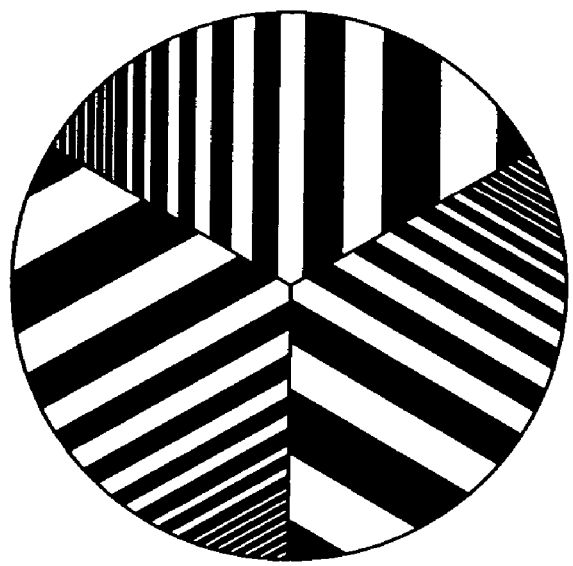
FIG. 9 is an explanatory diagram illustrating a pattern which is point-symmetric to the modulation pattern shown in FIG. 8.
Figure 10:
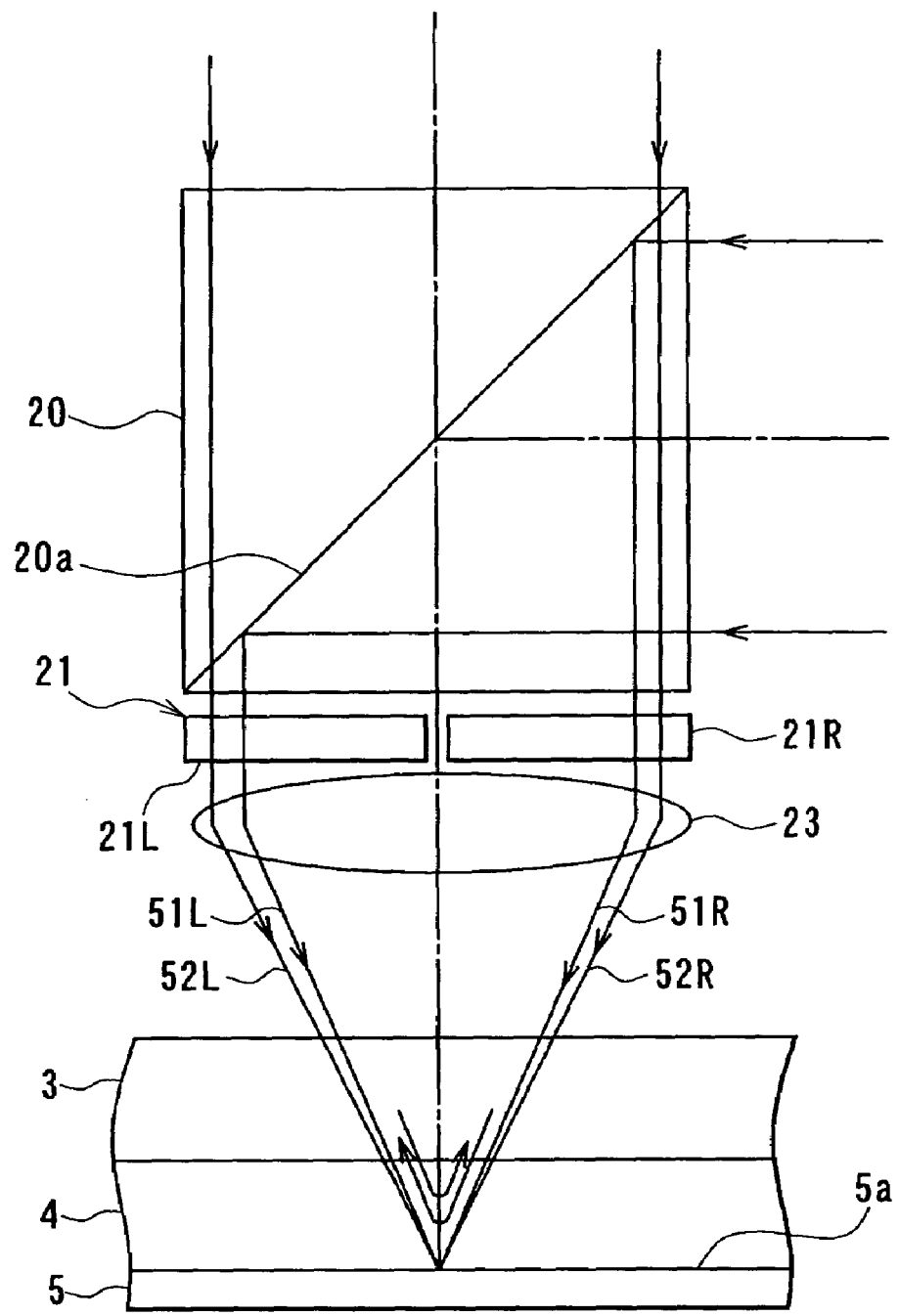
FIG. 10 is an explanatory diagram for explaining the principle of recording in the embodiment of the invention.

A recording operation will now be described with reference to FIG. 5 through FIG. 10. FIG. 5 is an explanatory diagram illustrating a state of the pick-up 11 during the recording operation. FIG. 6 is an explanatory diagram illustrating a state of light in the vicinity of the optical information recording medium 1 during the recording operation. FIG. 7 is an explanatory diagram illustrating an example of a pattern of the information light. FIG. 8 is an explanatory diagram illustrating an example of a modulation pattern of the recording-specific reference light. FIG. 9 is an explanatory diagram illustrating a pattern which is point-symmetric to the modulation pattern shown in FIG. 8. FIG. 10 is an explanatory diagram for explaining the principle of recording.

During the recording operation, the spatial light modulator 25 spatially modulates light passing therethrough by selecting a transmitting state (hereinafter also referred to as ON) or a blocking state (hereinafter also referred to as OFF) pixel by pixel according to information to be recorded, thereby generating information light having such a pattern as is shown in FIG. 7.

The phase spatial light modulator 17 spatially modulates the phase of light passing therethrough by selectively giving the light a phase difference of either 0 (rad) or $\pi$ (rad) from a predetermined reference phase pixel by pixel according to a predetermined modulation pattern, thereby generating recording-specific reference light having a spatially modulated phase.

The recording-specific reference light has such a modulation pattern that a pattern which is point-symmetric to the modulation pattern about the position of the optical axis of the optical system for irradiating the information recording layer 3 with the recording-specific reference light and the reproduction-specific reference light is not the same as the modulation pattern. FIG. 8 shows an example of such a modulation pattern. In FIG. 8, portions having a phase difference of 0 (rad) from the predetermined reference phase are shown as bright portions, while portions having a phase difference of $\pi$ (rad) from the predetermined reference phase are shown as dark portions. FIG. 9 shows a pattern which is point-symmetric to the modulation pattern shown in FIG. 8. As can be seen, the pattern which is point-symmetric to the modulation pattern shown in FIG. 8 is not the same as the original modulation pattern shown in FIG. 8.

The controller 90 supplies the information on the modulation pattern selected by itself or by the operating portion 91 to the phase spatial light modulator 17 in accordance with predetermined conditions. In accordance with the information on the modulation pattern supplied by the controller 90, the phase spatial light modulator 17 spatially modulates the phase of the light passing therethrough.

The power of light emitted by the light source device 12 is set to reach high levels on a pulse basis suitable for recording. The controller 90 predicts the timing at which the light emergent from the objective lens 23 passes through the data areas based on the basic clock reproduced from the reproduction signal RF, and maintains the foregoing setting while the light emergent from the objective lens 23 passes through the data areas. While the light emergent from the objective lens 23 passes through the data areas, neither focus servo nor tracking servo is performed and the objective lens 23 is fixed.

The light emitted by the light source device 12 is collimated by the collimator lens 13 and passes through the rotation-causing optical element 15 to be incident on the polarization beam splitter 16. P-polarized components of the light incident on the polarization beam splitter 16 are transmitted through the polarization beam splitter surface 16a and pass through the phase spatial light modulator 17, at which time the light is spatially modulated in phase to become recording-specific reference light. The recording-specific reference light is incident on the beam splitter 18.

Part of the recording-specific reference light incident on the beam splitter 18 is reflected by the beam splitter surface 18a and passes through the polarization beam splitter 20 to impinge on the two-way split optical rotation plate 21. Here, the recording-specific reference light that has passed through the optical rotation plate 21R of the two-way split optical rotation plate 21 becomes B-polarized light, while the recording-specific reference light that has passed through the optical rotation plate 21L becomes A-polarized light. The recording-specific reference light having passed through the two-way split optical rotation plate 21 is collected by the objective lens 23, is projected onto the optical information recording medium 1, and converges to a minimum diameter on the reflecting surface of the optical information recording medium 1.

On the other hand, S-polarized components of the light incident on the polarization beam splitter 16 are reflected by the polarization beam splitter surface 16a and pass through the spatial light modulator 25, at which time the light is spatially modulated in accordance with the information to be recorded, and thereby becomes information light. The information light is incident on the beam splitter 27. Part of the information light incident on the beam splitter 27 is reflected by the beam splitter surface 27a, and reflected by the beam splitter surface 20a of the polarization beam splitter 20, to impinge on the two-way split optical rotation plate 21. Here, the information light that has passed through the optical rotation plate 21R of the two-way split optical rotation plate 21 becomes A-polarized light, while the information light that has passed through the optical rotation plate 21L becomes B-polarized light. The information light having passed through the two-way split optical rotation plate 21 is collected by the objective lens 23, is projected onto the optical information recording medium 1, and converges to a minimum diameter on the reflecting surface of the optical information recording medium 1.

As shown in FIG. 6, according to the present embodiment, the information light and the recording-specific reference light are projected coaxially onto one side of the information recording layer 3 so as to converge on the reflecting surface.

The principle of recording of information according to the present embodiment will now be described with reference to FIG. 10. The information light 51R that impinges on the information recording medium 1 after having passed through the optical rotation plate 21R is A-polarized light. The recording-specific reference light 52L that impinges on the information recording medium 1 after having passed through the optical rotation plate 21L is also A-polarized light. The A-polarized recording-specific reference light 52L is reflected by the reflecting surface 5a of the information recording medium 1, and passes through the same area of the information recording layer 3 as the A-polarized information light 51R does. The light 51L and the light 52R interfere with each other to form an interference pattern because their directions of polarization coincide with each other. On the other hand, the A-polarized information light 51R is reflected by the reflecting surface 5a of the information recording medium 1, and passes through the same area of the information recording layer 3 as the A-polarized recording-specific reference light 52L does. The light 51L and the light 52R also interfere with each other to form an interference pattern because their directions of polarization coincide with each other. Thus, the interference pattern resulting from the interference between the A-polarized information light 51R yet to impinge on the reflecting surface 5a and the A-polarized recording-specific reference light 52L reflected by the reflecting surface 5a, and the interference pattern resulting from the interference between the A-polarized recording-specific reference light 52L yet to impinge on the reflecting surface 5a and the A-polarized information light 51R reflected by the reflecting surface 5a, are volumetrically recorded in the information recording layer 3.

Likewise, The information light 51L that impinges on the information recording medium 1 after having passed through the optical rotation plate 21L is B-polarized light. The recording-specific reference light 52R that impinges on the information recording medium 1 after having passed through the optical rotation plate 21R is also B-polarized light. The B-polarized recording-specific reference light 52R is reflected by the reflecting surface 5a of the information recording medium 1, and passes through the same area of the information recording layer 3 as the B-polarized information light 51L does. The light 51L and the light 52R interfere with each other to form an interference pattern because their directions of polarization coincide with each other. On the other hand, the B-polarized information light 51L is reflected by the reflecting surface 5a of the information recording medium 1, and passes through the same area of the information recording layer 3 as the B-polarized recording-specific reference light 52R does. The light 51L and the light 52R also interfere with each other to form an interference pattern because their directions of polarization coincide with each other. Thus, the interference pattern resulting from the interference between the B-polarized information light 51L yet to impinge on the reflecting surface 5a and the B-polarized recording-specific reference light 52R reflected by the reflecting surface 5a, and the interference pattern resulting from the interference between the B-polarized recording-specific reference light 51L yet to impinge on the reflecting surface 5a and the B-polarized information light 52R reflected by the reflecting surface 5a, are volumetrically recorded in the information recording layer 3.

In FIG. 6, the reference number 50 represents areas of the information recording layer 3 where the interference patterns resulting from the interference between the information light and the recording-specific reference light are recorded in the above-described manner.

The information light 51R that has passed through the optical rotation plate 21R and the information light 51L that has passed through the optical rotation plate 21L do not interfere with each other because they differ in direction of polarization by 90°. Likewise, the recording-specific reference light 52R that has passed through the optical rotation plate 21R and the recording-specific reference light 52L that has passed through the optical rotation plate 21L do not interfere with each other because they differ in direction of polarization by 90°.

According to the present embodiment, a plurality of pieces of information can be recorded in an identical location of the information recording layer 3 on a multiplex basis through phase-encoding multiplexing by changing the modulation pattern of the phase of the recording-specific reference light for each piece of the information to be recorded.

As shown in FIG. 5, part of the recording-specific reference light incident on the beam splitter 18 impinges on the photodetector 19. Based on signals outputted by the photodetector 19, the APC circuit 46 generates the signal $APC_{ref}$. On the other hand, part of the information light incident on the beam splitter 27 impinges on the photodetector 28. Based on signals outputted by the photodetector 28, the APC circuit 47 generates the signal $APC_{obj}$. Based on the signals $APC_{ref}$ and $APC_{obj}$, APC is performed so that the ratio between the intensities of the recording-specific reference light and the information light projected onto the optical information recording medium 1 is set at an optimum value. Specifically, the driving circuit 48 compares the signals $APC_{ref}$ and $APC_{obj}$ with each other, and drives the motor 42 to adjust the rotation-causing optical element 15 so as to obtain a desired ratio. When the light-receiving portion of the photodetector 19 is divided into a plurality of areas and the phase spatial light modulator 17 is capable of also adjusting the quantity of light transmitted thereby, the light to be projected onto the optical information recording medium 1 may be adjusted to have a uniform intensity distribution by adjusting the quantity of light transmitted by each pixel of the phase spatial light modulator 17 based on a signal outputted by each of the light-receiving portions of the photodetector 19. Likewise, when the light-receiving portion of the photodetector 28 is divided into a plurality of areas and the spatial light modulator 25 is capable of also adjusting the quantity of light transmitted thereby, the information light to be projected onto the optical information recording medium 1 may be adjusted to have a uniform intensity distribution by adjusting the quantity of light transmitted by each pixel of the spatial light modulator 25 based on a signal outputted by each of the light-receiving portions of the photodetector 28.

In the present embodiment, APC is performed based on the sum of the signals $APC_{ref}$ and $APC_{obj}$ so that the total intensity of the recording-specific reference light and the information light achieves an optimum value. Methods for controlling the total intensity of the recording-specific reference light and the information light include controlling over a peak value of the output of the light source device 12 and controlling over an emission pulse width and a time-course profile of the intensity of emitted light in the case where the light is emitted in the form of pulses.

Figure 11:
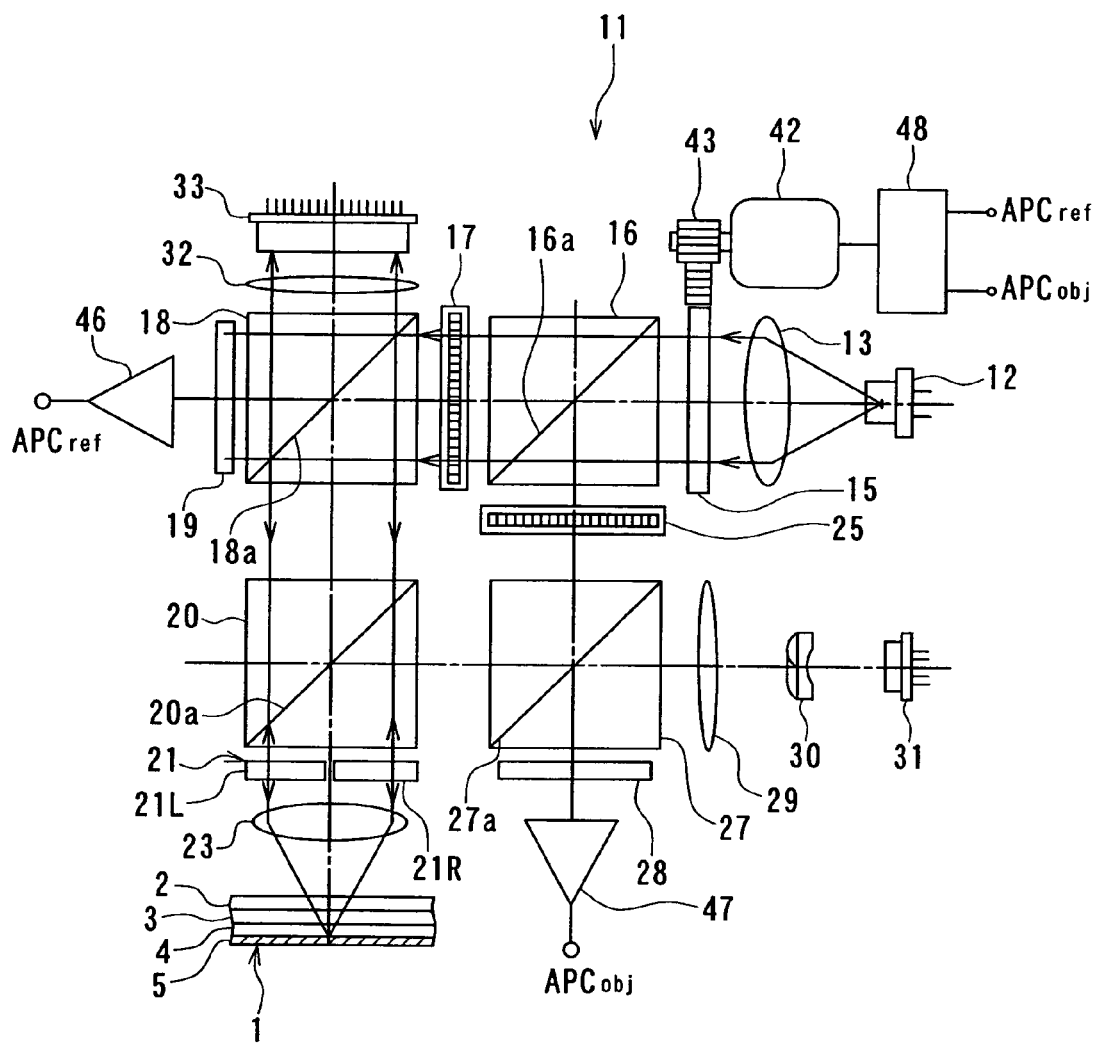
FIG. 11 is an explanatory diagram illustrating a state of the pick-up during a reproducing operation in the embodiment of the invention.
Figure 12:
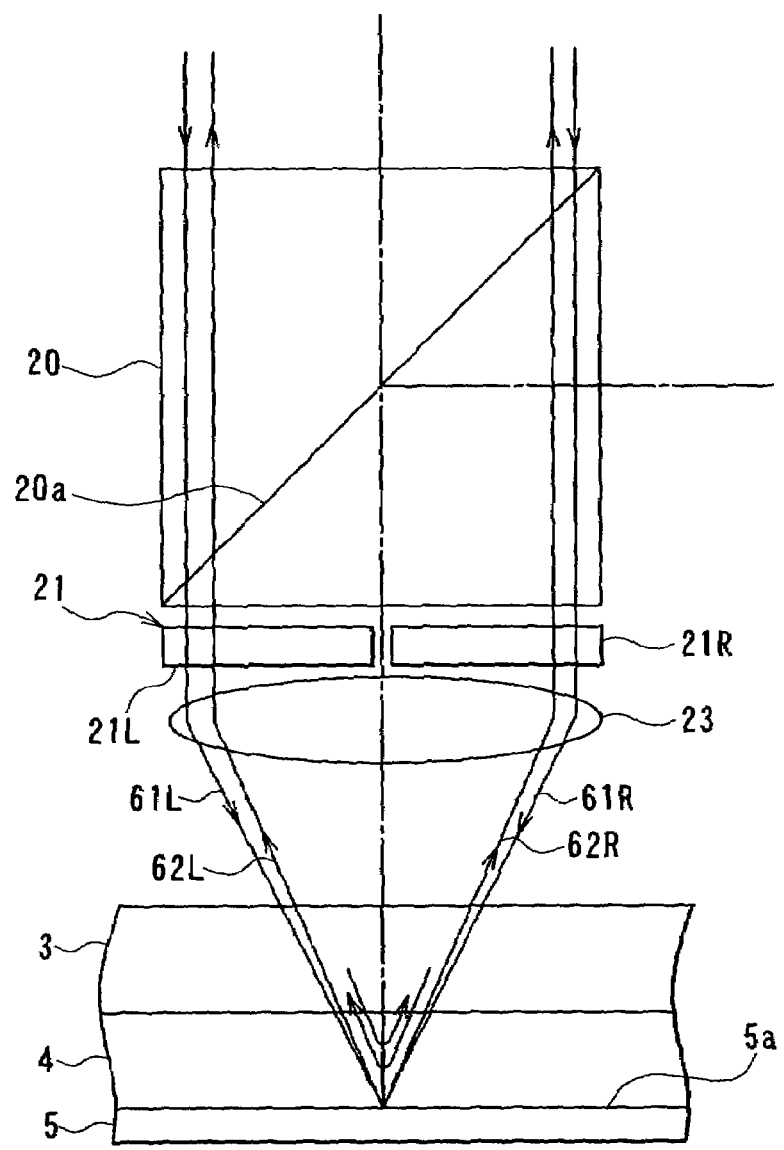
FIG. 12 is an explanatory diagram for explaining the principle of reproduction in the embodiment of the invention.

Description will now be given of the reproducing operation with reference to FIG. 11 and FIG. 12. FIG. 11 is an explanatory diagram illustrating a state of the pick-up 11 during the reproducing operation. FIG. 12 is an explanatory diagram for explaining the principle of reproduction.

During the reproducing operation, all pixels of the spatial light modulator 25 are brought into a blocking state. The phase spatial light modulator 17 spatially modulates the phase of light passing therethrough by selectively giving the light a phase difference of either 0 (rad) or π (rad) from a predetermined reference phase pixel by pixel according to a predetermined modulation pattern, thereby generating reproduction-specific reference light having a spatially modulated phase. Here, the reproduction-specific reference light is given a modulation pattern which is the same as the modulation pattern of the recording-specific reference light used for recording the information to be reproduced, or which is point-symmetric to the modulation pattern of the recording-specific reference light about the position of the optical axis of the optical system for irradiating the information recording layer 3 with the recording-specific reference light and the reproduction-specific reference light. In either case, the reproduction-specific reference light has such a modulation pattern that a pattern which is point-symmetric to the modulation pattern about the position of the optical axis of the optical system for irradiating the information recording layer 3 with the recording-specific reference light and the reproduction-specific reference light is not the same as the modulation pattern.

The light emitted by the light source device 12 is collimated by the collimator lens 13 and passes through the rotation-causing optical element 15 to be incident on the polarization beam splitter 16. S-polarized components of the light incident on the polarization beam splitter 16 are reflected by the polarization beam splitter surface 16a and are blocked by the spatial light modulator 25. P-polarized components of the light incident on the polarization beam splitter 16 are transmitted by the polarization beam splitter surface 16a and pass through the phase spatial light modulator 17, at which time the light is spatially modulated in phase to become reproduction-specific reference light. The reproduction-specific reference light is incident on the beam splitter 18. Part of the reproduction-specific reference light incident on the beam splitter 18 is reflected by the beam splitter surface 18a and passes through the polarization beam splitter 20 to impinge on the two-way split optical rotation plate 21. Here, the reproduction-specific reference light that has passed through the optical rotation plate 21R of the two-way split optical rotation plate 21 becomes B-polarized light, while the reproduction-specific reference light that has passed through the optical rotation plate 21L becomes A-polarized light. The reproduction-specific reference light having passed through the two-way split optical rotation plate 21 is collected by the objective lens 23, is projected onto the optical information recording medium 1, and converges to a minimum diameter on the reflecting surface of the optical information recording medium 1.

The positioning (servo control) of the reproduction-specific reference light with respect to the optical information recording medium 1 can be performed in the same manner as the positioning of the recording-specific reference light and the information light in the recording operation.

The principle of reproduction of information in the present embodiment will now be described with reference to FIG. 12. The reproduction-specific reference light 61R that impinges on the information recording medium 1 after having passed through the optical rotation plate 21R is B-polarized light. On the other hand, the reproduction-specific reference light 61L that impinges on the information recording medium 1 after having passed through the optical rotation plate 21L is A-polarized light. In the information recording layer 3, the reproduction-specific reference light yet to be reflected by the reflecting surface 5a generates reproduction light which travels away from the reflecting surface 5a, and the reproduction-specific reference light reflected by the reflecting surface 5a generates reproduction light which travels toward the reflecting surface 5a. The reproduction light traveling away from the reflecting surface 5a is emitted as-is from the optical information recording medium 1. The reproduction light traveling toward the reflecting surface 5a is reflected by the reflecting surface 5a and emitted from the optical information recording medium 1.

The reproduction light is collimated by the objective lens 23 and then impinges on the two-way split optical rotation plate 21. Here, the reproduction light 62R to impinge on the optical rotation plate 21R of the two-way split optical rotation plate 21 is B-polarized light before impinging on the optical rotation plate 21R, and becomes P-polarized light after passing through the optical rotation plate 21R. On the other hand, the reproduction light 62L to impinge on the optical rotation plate 21L of the two-way split optical rotation plate 21 is A-polarized light before impinging on the optical rotation plate 21L, and becomes P-polarized light after passing through the optical rotation plate 21L. Thus, the reproduction light having passed through the two-way split optical rotation plate 21 becomes P-polarized light over the entire cross section of the beam thereof.

The reproduction light having passed through the two-way split optical rotation plate 21 is incident on the polarization beam splitter 20 and transmitted by the polarization beam splitter surface 20a to be incident on the beam splitter 18. Part of the reproduction light incident on the beam splitter 18 is transmitted by the beam splitter surface 18a and passes through the imaging lens 32 to impinge on the CCD array 33.

On the CCD array 33 is formed an image of the ON/OFF pattern caused by the spatial light modulator 25 in the recording operation, so that information is reproduced by detecting this pattern. When a plurality of pieces of information are recorded in the information recording layer 3 on a multiplex basis by changing modulation patterns of the recording-specific reference light, among the plurality of pieces of information, the one corresponding to the modulation pattern of the reproduction-specific reference light is only reproduced. In the case where the reproduction-specific reference light has the same modulation pattern as that of the recording-specific reference light used for recording the information to be reproduced, the reproduction light has a pattern which is inverted (mirror pattern) from the pattern of the information light used in the recording operation. In the case where the reproduction-specific reference light has a modulation pattern which is point-symmetric to the modulation pattern of the recording-specific reference light used for recording the information to be reproduced, the reproduction light has the same pattern as that of the information light used in the recording operation. In either case, it is possible to reproduce information based on the pattern of the information light.

The reproduction-specific reference light 61R incident on the information recording medium 1 after having passed through the optical rotation plate 21R is reflected by the reflecting surface 5a and emitted from the optical information recording medium 1. The light then passes through the optical rotation plate 21L and is converted into S-polarized return light. On the other hand, the reproduction-specific reference light 61L incident on the information recording medium 1 after having passed through the optical rotation plate 21L is reflected by the reflecting surface 5a and emitted from the optical information recording medium 1. The light then passes through the optical rotation plate 21R and is converted into S-polarized return light. Thus, the return light having passed through the two-way split optical rotation plate 21 becomes S-polarized light over the entire cross section of the beam thereof. Since the return light impinges on the polarization beam splitter 20 to be reflected by the polarization beam splitter surface 20a, it does not impinge on the CCD array 33.

Part of the reproduction-specific reference light incident on the beam splitter 18 impinges on the photodetector 19. Based on signals outputted by the photodetector 19, the APC circuit 46 generates a signal $APC_{ref}$. APC is performed based on the signal $APC_{ref}$ so that the optical information recording medium 1 is irradiated with a constant quantity of the reproduction-specific reference light. Specifically, the driving circuit 48 drives the motor 42 to adjust the rotation-causing optical element 15 so that the signal $APC_{ref}$ equals a predetermined value. Alternatively, during the reproducing operation, APC may be performed by setting the rotation-causing optical element 15 such that light which has passed through the rotation-causing optical element 15 has P-polarized components only, and by adjusting the output of the light source device 12. When the light-receiving portion of the photodetector 19 is divided into a plurality of areas and the phase spatial light modulator 17 is capable of also adjusting the quantity of light transmitted thereby, the light to be projected onto the optical information recording medium 1 may be adjusted to have a uniform intensity distribution by adjusting the quantity of light transmitted by each pixel of the phase spatial light modulator 17 based on a signal outputted by each of the light-receiving portions of the photodetector 19.

As described in the foregoing, according to the present embodiment, to record information, the information light and the recording-specific reference light are projected coaxially onto one side of the information recording layer 3 such that they converge on the reflecting surface.

Furthermore, to record information, each of the recording-specific reference light having a first direction of polarization (P-polarized) and the information light having a second direction of polarization (S-polarized) that is different from the first direction of polarization (P-polarized) is optically rotated by the two-way split optical rotation plate 21 serving as the optical rotation means in directions different between respective half areas of the cross section of the beam thereof. Thus, for each of the information light and the recording-specific reference light, the direction of polarization is set to be different between the respective half areas of the cross section of the beam thereof such that the direction of polarization of the information light yet to impinge on the reflecting surface coincides with that of the recording-specific reference light reflected by the reflecting surface, and the direction of polarization of the recording-specific reference light yet to impinge on the reflecting surface coincides with that of the information light reflected by the reflecting surface. As a result, in the information recording layer 3, an interference pattern resulting from interference between the information light yet to impinge on the reflecting surface and the recording-specific reference light reflected by the reflecting surface is recorded, and also an interference pattern resulting from interference between the recording-specific reference light yet to impinge on the reflecting surface and the information light reflected by the reflecting surface is recorded.

On the other hand, to reproduce information, the reproduction-specific reference light is projected onto the information recording layer 3 so as to converge on the reflecting surface. The projection of the reproduction-specific reference light and the collection of the reproduction light are performed on one side of the information recording layer 3, and the reproduction-specific reference light and the reproduction light are arranged coaxially.

Furthermore, to reproduce information, the reproduction-specific reference light having the first direction of polarization (P-polarized) is optically rotated by the two-way split optical rotation plate 21 in directions different between respective half areas of the cross section of the beam thereof, converted into reproduction-specific reference light having different directions of polarization for the respective half areas, and projected onto the information recording layer 3. Reproduction light and return light resulting from the reproduction-specific reference light reflected by the reflecting surface are each optically rotated by the two-way split optical rotation plate 21 in directions different between the respective half areas, and converted into reproduction light having the first direction of polarization (P-polarized) over the entire cross section of the beam thereof and return light having the second direction of polarization (S-polarized) over the entire cross section of the beam thereof. It is thereby possible to separate the reproduction light and the return light from each other by the polarization beam splitter 20 serving as the polarization separation means, and consequently, it is possible to improve the SN ratio of the reproduced information.

According to the embodiment, the information light can carry information using the entire cross section of the beam thereof. Likewise, the reproduction light can also carry information using the entire cross section of the beam thereof.

From the foregoing, the embodiment makes it possible to record and reproduce information through the use of holography and to achieve a compact configuration of the optical system for recording and reproduction without causing a reduction in the amount of information.

Furthermore, in the embodiment, the recording-specific reference light and the reproduction-specific reference light each have such a modulation pattern that a pattern which is point-symmetric to the modulation pattern about the position of the optical axis of the optical system for irradiating the information recording layer 3 with the recording-specific reference light and the reproduction-specific reference light is not the same as the modulation pattern. Therefore, according to the embodiment, when reproducing information it is possible to prevent simultaneous occurrences of a pattern the same as the pattern of the information light used for recording the information and a mirror pattern thereof.

The present invention is not limited to the foregoing embodiment and may be modified in various ways. For example, in the foregoing embodiment, the address information and the like are recorded in advance in the form of emboss pits on the address servo areas of the optical information recording medium 1. However, the address information and the like may be recorded in the following manner without providing the emboss pits in advance. In this case, the optical information recording medium 1 shall be configured such that the information recording layer 3 and the reflecting layer 5 are next to each other without the transparent substrate 4. Then, in the address servo areas of this optical information recording medium 1, the information recording layer 3 is irradiated with laser light of high output selectively at a portion closer to the reflecting layer 5. The portion is thereby selectively changed in refractive index so that address information and the like are recorded to perform formatting.

In the embodiment, information is recorded on a multiplex basis by phase-encoding multiplexing. However, the present invention also covers the cases where multiplex recording by phase-encoding multiplexing is not conducted.

As described in the foregoing, in the optical information recording apparatus or the optical information recording method of the invention, the information light and the recording-specific reference light are projected coaxially onto one side of the information recording layer so as to converge on the reflecting surface. In the information recording layer, the direction of polarization of the information light yet to impinge on the reflecting surface coincides with that of the recording-specific reference light reflected by the reflecting surface, so that an interference pattern resulting from the interference therebetween is recorded. On the other hand, the direction of polarization of the recording-specific reference light yet to impinge on the reflecting surface coincides with that of the information light reflected by the reflecting surface, so that an interference pattern resulting from the interference therebetween is recorded. Furthermore, in the invention, the information light can carry information using the entire cross section of the beam thereof. The invention therefore makes it possible to record information through the use of holography and to achieve compact configuration of the optical system for recording without causing a reduction in the amount of information.

According to the optical information reproducing apparatus or the optical information reproducing method of the invention, the reproduction-specific reference light is projected onto the information recording layer so as to converge on the reflecting surface. The projection of the reproduction-specific reference light and the collection of the reproduction light are performed on one side of the information recording layer, and the reproduction-specific reference light and the reproduction light are arranged coaxially. Furthermore, in the invention, the reproduction-specific reference light having a predetermined first direction of polarization is optically rotated in directions different between respective half areas of a cross section of the beam of the light, and thereby converted into reproduction-specific reference light having directions of polarization different between the respective areas to irradiate the information recording layer therewith, and reproduction light and return light are each optically rotated in directions different between the respective areas and thereby converted into reproduction light having the first direction of polarization over the entire cross section of the beam thereof and return light having a second direction of polarization which is different from the first direction of polarization over the entire cross section of the beam thereof. Furthermore, in the invention, the information light can carry information using the entire cross section of the beam thereof, and likewise, the reproduction light can also carry information using the entire cross section of the beam thereof. The invention therefore makes it possible to reproduce information through the use of holography and to achieve compact configuration of the optical system for reproduction without causing a reduction in the amount of information.

According to the optical information recording/reproducing apparatus or the optical information recording/reproducing method of the invention, it is possible to record and reproduce information through the use of holography and to achieve compact configuration of the optical system for recording and reproduction without causing a reduction in the amount of information, through the same operation as that of the optical information recording apparatus or the optical information recording method described above and the same operation as that of the optical information reproducing apparatus or the optical information reproducing method described above.

It is apparent from the foregoing description that the invention may be carried out in various modes and may be modified in various ways. It is therefore to be understood that within the scope of equivalence of the appended claims the invention may be practiced in modes other than the foregoing best modes.

The invetion claimed is:

1. An optical information recording apparatus for recording information in an optical information recording medium having an information recording layer in which information is recorded through the use of holography and one side of which is irradiated with light for recording or reproducing information, and a reflecting surface disposed on the other side of the information recording layer, the apparatus comprising:

information light generation means for generating information light that carries information;

recording-specific reference light generation means for generating recording-specific reference light; and a recording optical system for irradiating the information recording layer with the information light generated by the information light generation means and the recording-specific reference light generated by the recording-specific reference light generation means such that the information is recorded in the information recording layer in the form of an interference pattern resulting from interference between the information light and the recording-specific reference light, wherein the recording optical system projects the information light and the recording-specific reference light coaxially onto the one side of the information recording layer such that they converge on the reflecting surface, and the recording optical system causes each of the information light and the recording-specific reference light to have directions of polarization that are different between respective half areas of a cross section of a beam thereof such that the direction of polarization of the information light yet to impinge on the reflecting surface coincides with that of the recording-specific reference light reflected by the reflecting surface, and the direction of polarization of the recording-specific reference light yet to impinge on the reflecting surface coincides with that of the information light reflected by the reflecting surface.

2. An optical information recording apparatus according to claim 1, wherein the recording optical system has optical rotation means for optically rotating light passing therethrough in directions different between the respective areas, and optically rotates, with the optical rotation means, each of the recording-specific reference light having a predetermined first direction of polarization and the information light having a second direction of polarization different from the first direction of polarization to make the directions of polarization different between the respective areas.

3. An optical information recording apparatus according to claim 1, wherein the recording-specific reference light generation means generates recording-specific reference light having a spatially modulated phase.

4. An optical information recording apparatus according to claim 3, wherein the recording-specific reference light has such a modulation pattern that a pattern which is point-symmetric to the modulation pattern about the position of an optical axis of the optical system for irradiating the information recording layer with the recording-specific reference light is not the same as the modulation pattern.

5. An optical information recording method for recording information in an optical information recording medium having an information recording layer in which information is recorded through the use of holography and one side of which is irradiated with light for recording or reproducing information, and a reflecting surface disposed on the other side of the information recording layer, the method comprising:

a step of generating information light that carries information;

a step of generating recording-specific reference light; and a recording step in which the information recording layer is irradiated with the information light and the recording-specific reference light such that the information is recorded in the information recording layer in the form of an interference pattern resulting from interference between the information light and the recording-specific reference light, wherein in the recording step, the information light and the recording-specific reference light are projected coaxially onto the one side of the information recording layer such that they converge on the reflecting surface, and in the recording step, each of the information light and the recording-specific reference light is made to have directions of polarization that are different between respective half areas of a cross section of a beam thereof such that the direction of polarization of the information light yet to impinge on the reflecting surface coincides with that of the recording-specific reference light reflected by the reflecting surface, and the direction of polarization of the recording-specific reference light yet to impinge on the reflecting surface coincides with that of the information light reflected by the reflecting surface.

6. An optical information recording method according to claim 5, wherein, in the recording optical step, each of the recording-specific reference light having a predetermined first direction of polarization and the information light having a second direction of polarization different from the first direction of polarization is optically rotated in directions different between the respective areas to make the directions of polarization different between the respective areas.

7. An optical information recording method according to claim 5, wherein the step of generating recording-specific reference light generates recording-specific reference light having a spatially modulated phase.

8. An optical information recording method according to claim 7, wherein the recording-specific reference light has such a modulation pattern that a pattern which is point-symmetric to the modulation pattern about the position of an optical axis of the optical system for irradiating the information recording layer with the recording-specific reference light is not the same as the modulation pattern.

9. An optical information reproducing apparatus for reproducing information through the use of holography from an optical information recording medium having an information recording layer in which information is recorded through the use of holography and one side which is irradiated with light for recording or reproducing information, and a reflecting surface disposed on the other side of the information recording layer, the information being recorded in the information recording layer based on information light and recording-specific reference light that are projected coaxiaUy onto the one side of the information recording layer such that they converge on the reflecting surface, in the form of an interference pattern resulting from interference between the information light yet to impinge on the reflecting surface and the recording-specific reference light reflected by the reflecting surface and an interference pattern resulting from interference between the recording-specific reference light yet to impinge on the reflecting surface and the information light reflected by the reflecting surface, the apparatus comprising:

reproduction-specific reference light generation means for generating reproduction-specific reference light;

a reproducing optical system for irradiating the information recording layer with the reproduction-specific reference light generated by the reproduction-specific reference light generation means and for collecting reproduction light generated at the information recording layer when irradiated with the reproduction-specific reference light; and detection means for detecting the reproduction light collected by the reproducing optical system, wherein the reproducing optical system projects the reproduction-specific reference light onto the information recording layer to allow it to converge on the reflecting surface, such that the irradiation with the reproduction-specific reference light and the collection of the reproduction light are performed on the one side, and that the reproduction-specific reference light and the reproduction light are arranged coaxially, and the reproducing optical system has optical rotation means for optically rotating light passing therethrough in directions different between respective half areas of a cross section of a beam of the light, and optically rotates, with the optical rotation means, the reproduction-specific reference light having a predetermined first direction of polarization to convert the same into reproduction-specific reference light having directions of polarization different between the respective areas to irradiate the information recording layer therewith, and optically rotates, with the optical rotation means, the reproduction light and return light resulting from the reproduction-specific reference light reflected by the reflecting surface to convert them into reproduction light having the first direction of polarization over an entire cross section of a beam thereof and return light having a second direction of polarization different from the first direction of polarization over an entire cross section of a beam thereof.

10. An optical information reproducing apparatus according to claim 9, wherein the reproducing optical system further has polarization separation means for separating the reproduction light having passed through the optical rotation means and the return light having passed through the optical rotation means from each other depending on a difference in direction of polarization.

11. An optical information reproducing apparatus according to claim 9, wherein the reproduction-specific reference light generation means generates reproduction-specific reference light having a spatially modulated phase.

12. An optical information reproducing apparatus according to claim 11, wherein the reproduction-specific reference light has such a modulation pattern that a pattern which is point-symmetric to the modulation pattern about the position of an optical axis of the optical system for irradiating the information recording layer with the reproduction-specific reference light is not the same as the modulation pattern.

13. An optical information reproducing method for reproducing information through the use of holography from an optical information recording medium having an information recording layer in which information is recorded through the use of holography and one side of which is irradiated with light for recording or reproducing information, and a reflecting surface disposed on the other side of the information recording layer, the information being recorded in the information recording layer based on information light and recording-specific reference light that are projected coaxially onto the one side of the information recording layer such that they converge on the reflecting surface, in the form of an interference pattern resulting from interference between the information light yet to impinge on the reflecting surface and the recording-specific reference light reflected by the reflecting surface and an interference pattern resulting from interference between the recording-specific reference light yet to impinge on the reflecting surface and the information light reflected by the reflecting surface, the method comprising;

a step of generating reproduction-specific reference light;

a reproducing step in which the information recording layer is irradiated with the reproduction-specific reference light generated by the reproduction-specific reference light generation means, and reproduction light generated at the information recording layer when irradiated with the reproduction-specific reference light is collected; and a step of detecting the reproduction light, wherein in the reproducing step, the reproduction-specific reference light is projected onto the information recording layer so as to converge on the reflecting surface such that the irradiation with the reproduction-specific reference light and the collection of the reproduction light are performed on the one side, and that the reproduction-specific reference light and the reproduction light are arranged coaxially, and in the reproducing step, the reproduction-specific reference light having a predetermined first direction of polarization is optically rotated in directions different between respective half areas of a cross section of a beam thereof, and thereby converted into reproduction-specific reference light having directions of polarization different between the respective areas to irradiate the information recording layer therewith, and the reproduction light and return light resulting from the reproduction-specific reference light reflected by the reflecting surface are each optically rotated in directions different between the respective areas and thereby converted into reproduction light having the first direction of polarization over an entire cross section of a beam thereof and return light having a second direction of polarization different from the first direction of polarization over an entire cross section of a beam thereof.

14. An optical information reproducing method according to claim 13, wherein the reproducing step separates the reproduction light that has been optically rotated and the return light that has been optically rotated from each other depending on a difference in direction of polarization.

15. An optical information reproducing method according to claim 13, wherein the step of generating reproduction-specific reference light generates reproduction-specific reference light having a spatially modulated phase.

16. An optical information reproducing method according to claim 15, wherein the reproduction-specific reference light has such a modulation pattern that a pattern which is point-symmefric to the modulation pattern about the position of an optical axis of the optical system for irradiating the information recording layer with the reproduction-specific reference light is not the same as the modulation pattern.

17. An optical information recording/reproducing apparatus for recording information in an optical information recording medium having an information recording layer in which information is recorded through the use of holography and one side of which is irradiated with light for recording or reproducing information, and a reflecting surface disposed on the other side of the information recording layer, and for reproducing information from the optical information recording medium, the apparatus comprising:

information light generation means for generating information light that carries information;

recording-specific reference light generation means for generating recording-specific reference light;

reproduction-specific reference light generation means for generating reproduction-specific reference light;

a recording/reproducing optical system for, to record information, irradiating the information recording layer with the information light generated by the information light generation means and the recording-specific reference light generated by the recording-specific reference light generation means such that information is recorded in the information recording layer in the form of an interference pattern resulting from interference between the information light and the recording-specific reference light, and, to reproduce information, irradiating the information recording layer with the reproduction-specific reference light generated by the reproduction-specific reference light generation means and collecting reproduction light generated at the information recording layer when irradiated with the reproduction-specific reference light; and detection means for detecting the reproduction light collected by the recording/reproducing optical system, wherein the recording/reproducing optical system has optical rotation means for optically rotating light passing therethrough in directions different between respective half areas of a cross section of a beam of the light, to record information, the recording/reproducing optical system projects the information light and the recording-specific reference light coaxially onto the one side of the information recording layer such that they converge on the reflecting surface, to record information, the recording/reproducing optical system optically rotates, with the optical rotation means, each of the recording-specific reference light having a predetermined first direction of polarization and the information light having a second direction of polarization different from the first direction of polarization to cause each of the information light and the recording-specific reference light to have directions of polarization different between the respective areas, such that the direction of polarization of the information light yet to impinge on the reflecting surface coincides with that of the recording-specific reference light reflected byte reflecting surface, and the direction of polarization of the recording-specific reference light yet to impinge on the reflecting surface coincides with that of the information light reflected by the reflecting surface, to reproduce information, the recording/reproducing optical system projects the reproduction-specific reference light onto the information recording layer to allow it to converge on the reflecting surface, such that the irradiation with the reproduction-specific reference light and the collection of the reproduction light are performed on the one side, and that the reproduction-specific reference light and the reproduction light are arranged coaxially, and to reproduce information, the recording/reproducing optical system optically rotates, wit the optical rotation means, the reproduction-specific reference light having the first direction of polarization to convert the same into reproduction-specific reference light having directions of polarization different between the respective areas to irradiate the information recording layer therewith, and optically rotates, with the optical rotation means, the reproduction light and return light resulting from the reproduction-specific reference light reflected by the reflecting surface to convert them into reproduction light having the first direction of polarization over an entire cross section of a beam thereof and return light having a second direction of polarization different from the first direction of polarization over an entire cross section of a beam thereof.

18. An optical information recording/reproducing apparatus according to claim 17, wherein the recording/reproducing optical system further has polarization separation means for separating the reproduction light having passed through the optical rotation means and the return light having passed through the optical rotation means from each other depending on a difference in direction of polarization.

19. An optical information recording/reproducing apparatus according to claim 17, wherein the recording-specific reference light generation means generates recording-specific reference light having a spatially modulated phase, and the reproduction-specific reference light generation means generates reproduction-specific reference light having a spatially modulated phase.

20. An optical information recording/reproducing apparatus according to claim 19, wherein the recording-specific reference light and the reproduction-specific reference light each have such a modulation pattern that a pattern which is point-symmetric to the modulation pattern about the position of an optical axis of the optical system for irradiating the information recording layer with the recording-specific reference light and the reproduction-specific reference light is not the same as the modulation pattern.

21. An optical information recording/reproducing method for recording information in an optical information recording medium having an information recording layer in which information is recorded through the use of holography and one side of which is irradiated with light for recording or reproducing information, and a reflecting surface disposed on the other side of the information recording layer, and for reproducing information from the optical information recording medium, the method comprising:
   a step of generating information light that carries information;
   a step of generating recording-specific reference light;
   a recording step in which the information recording layer is irradiated with the information light and the recording-specific reference light such that the information is recorded in the information recording layer in the form of an interference pattern resulting from interference between the information light and the recording-specific reference light;
   a step of generating reproduction-specific reference light;
   a reproducing step in which the information recording layer is irradiated with the reproduction-specific reference light, and reproduction light generated at the information recording layer when irradiated with the reproduction-specific reference light is collected; and
   a step of detecting the reproduction light, wherein in the recording step, the information light and the recording-specific reference light are projected coaxially onto the one side of the information recording layer such that they converge on the reflecting surface,
   in the recording step, each of the recording-specific reference light having a predetermined first direction of polarization and the information light having a second direction of polarization different from the first direction of polarization is optically rotated in directions different between respective half areas of a cross section of a beam thereof to cause each of the information light and the recording-specific reference light to have directions of polarization different between the respective areas, such that the direction of polarization of the information light yet to impinge on the reflecting surface coincides with that of the recording-specific reference light reflected by the reflecting surface, and the direction of polarization of the recording-specific reference light yet to impinge on the reflecting surface coincides with that of the information light reflected by the reflecting surface,
   in the reproducing step, the reproduction-specific reference light is projected onto the information recording layer so as to converge on the reflecting surface, such that the irradiation with the reproduction-specific reference light and the collection of the reproduction light are performed on the one side, and that the reproduction-specific reference light and the reproduction light are arranged coaxially, and
   in the reproducing step, the reproduction-specific reference light having a predetermined first direction of polarization is optically rotated in directions different between respective half areas of a cross section of a beam thereof, and thereby converted into reproduction-specific reference light having directions of polarization different between the respective areas to irradiate the information recording layer therewith, and the reproduction light and return light resulting from the reproduction-specific reference light reflected by the reflecting surface are each optically rotated in directions different between the respective areas and thereby converted into reproduction light having the first direction of polarization over an entire cross section of a beam thereof and return light having a second direction of polarization different from the first direction of polarization over an entire cross section of a beam thereof.

22. An optical information recording/reproducing method according to claim 21, wherein the reproducing step separates the reproduction light-that has been optically rotated and the return light that has been optically rotated from each other depending on a difference in direction of polarization.

23. An optical information recording/reproducing method according to claim 21, wherein the step of generating recording-specific reference light generates recording-specific reference light having a spatially modulated phase, and the step of generating reproduction-specific reference light generates reproduction-specific reference light having a spatially modulated phase.

24. An optical information recording/reproducing method according to claim 23, wherein the recording-specific reference light and the reproduction-specific reference light each have such a modulation pattern that a pattern which is point-symmetric to the modulation pattern about the position of an optical axis of the optical system for irradiating the information recording layer with the recording-specific reference light and the reproduction-specific reference light is not the same as the modulation pattern.

* * * * *